United States Patent
Tani et al.

(10) Patent No.: US 8,724,076 B2
(45) Date of Patent: May 13, 2014

(54) PROJECTION EXPOSURE APPARATUS, CLEANING AND MAINTENANCE METHODS OF A PROJECTION EXPOSURE APPARATUS, AND DEVICE MANUFACTURING METHOD

(75) Inventors: Yasuhisa Tani, Tokyo (JP); Masaki Shiozawa, Sagamihara (JP)

(73) Assignee: Nikon Corporation, Tokyo (JP)

( * ) Notice: Subject to any disclaimer, the term of this patent is extended or adjusted under 35 U.S.C. 154(b) by 376 days.

(21) Appl. No.: 13/064,362

(22) Filed: Mar. 21, 2011

(65) Prior Publication Data

US 2011/0170080 A1    Jul. 14, 2011

Related U.S. Application Data

(60) Division of application No. 11/386,777, filed on Mar. 23, 2006, now Pat. No. 8,035,797, which is a continuation of application No. PCT/JP2004/013906, filed on Sep. 24, 2004.

(30) Foreign Application Priority Data

Sep. 26, 2003  (JP) ................................. 2003-335691
Sep. 30, 2003  (JP) ................................. 2003-339625

(51) Int. Cl.
*G03B 27/52* (2006.01)
(52) U.S. Cl.
USPC .............................................. 355/30; 355/53
(58) Field of Classification Search
USPC ...................................................... 355/30, 53
See application file for complete search history.

(56) References Cited

U.S. PATENT DOCUMENTS

| | | | |
|---|---|---|---|
| 4,346,164 | A | 8/1982 | Tabarelli et al. |
| 4,480,910 | A | 11/1984 | Takanashi et al. |
| 4,509,852 | A | 4/1985 | Tabarelli et al. |
| 5,237,865 | A | 8/1993 | Wada |
| 5,610,683 | A | 3/1997 | Takahashi |
| 5,715,039 | A | 2/1998 | Fukuda et al. |
| 5,825,043 | A | 10/1998 | Suwa |
| 5,969,441 | A | 10/1999 | Loopstra et al. |
| 6,063,267 | A | 5/2000 | Crewson et al. |
| 6,400,441 | B1 | 6/2002 | Nishi et al. |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Korean Patent Office, Notice of Grounds for Rejection mailed Sep. 26, 2012 in Korean Patent Application No. 10-2012-7017911 w/English-language Translation.

(Continued)

*Primary Examiner* — Steven H Whitesell Gordon
*Assistant Examiner* — Mesfin T Asfaw
(74) *Attorney, Agent, or Firm* — Oliff PLC

(57) ABSTRACT

A projection exposure apparatus that exposes a substrate with a liquid interposed between a surface of the substrate and an optical element on the substrate side of a projection optical system; includes liquid supply and discharge mechanisms, which supply the liquid via a liquid supply tube as they recover the liquid via a liquid recovery tube, and an adhesion preventing mechanism that prevents an adhesion of impurities on member forming a flow path for the liquid.

15 Claims, 12 Drawing Sheets

(56) References Cited

U.S. PATENT DOCUMENTS

| | | |
|---|---|---|
| 7,050,146 B2 | 5/2006 | Duineveld et al. |
| 2001/0026354 A1 | 10/2001 | Aoki |
| 2004/0029026 A1 | 2/2004 | Hayasaki et al. |
| 2004/0075895 A1 | 4/2004 | Lin |
| 2004/0165159 A1 | 8/2004 | Lof et al. |
| 2005/0024609 A1 | 2/2005 | De Smit et al. |
| 2005/0174549 A1 | 8/2005 | Duineveld et al. |
| 2006/0232757 A1 | 10/2006 | Tani et al. |
| 2007/0115453 A1 | 5/2007 | Coon et al. |
| 2007/0268468 A1 | 11/2007 | Coon et al. |

FOREIGN PATENT DOCUMENTS

| | | |
|---|---|---|
| EP | 1 486 827 A2 | 12/2004 |
| EP | 1 628 329 A1 | 2/2006 |
| EP | 1 635 382 A1 | 3/2006 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-6-124874 | 5/1994 |
| JP | A-6-168866 | 6/1994 |
| JP | A-7-220990 | 8/1995 |
| JP | A-8-316125 | 11/1996 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-176727 | 7/1999 |
| JP | A-2000-58436 | 2/2000 |
| JP | A-2000-124179 | 4/2000 |
| JP | A-2000-505958 | 5/2000 |
| KR | 10-2003-0064652 A | 8/2003 |
| WO | WO 98/28665 | 7/1998 |
| WO | WO 99/49504 | 9/1999 |
| WO | WO 2004/019128 A2 | 3/2004 |
| WO | WO 2004/093130 A2 | 10/2004 |
| WO | WO 2004/093159 A2 | 10/2004 |
| WO | WO 2005/031820 A1 | 4/2005 |

OTHER PUBLICATIONS

Dec. 28, 2004 International Search Report for PCT/JP2004/013906 (with translation).
Dec. 28, 2004 Written Opinion of the International Searching Authority for PCT/JP2004/013906 (with translation).
Sep. 15, 2008 Supplementary European Search Report for European Patent Application No. 04788065.3.
Dec. 15, 2009 Office Action for Japanese Patent Application No. 2005-514207 (with translation).
May 29, 2008 Office Action for U.S. Appl. No. 11/386,777.
Mar. 18, 2009 Office Action for U.S. Appl. No. 11/386,777.
Dec. 8, 2009 Office Action for U.S. Appl. No. 11/386,777.
Aug. 20, 2010 Notice of Allowance for U.S. Appl. No. 11/386,777.
Dec. 17, 2010 Notice of Allowance for U.S. Appl. No. 11/386,777.
Mar. 14, 2011 Office Action in Korean Application No. 2006-7005687, with translation.
Mar. 22, 2013 Office Action issued in European Application No. 04 788 065.3.
Jan. 11, 2012 Office Action in Korean Application No. 2011-7021426 (with English translation).

PROJECTION EXPOSURE APPARATUS, CLEANING AND MAINTENANCE METHODS OF A PROJECTION EXPOSURE APPARATUS, AND DEVICE MANUFACTURING METHOD

CROSS-REFERENCE TO RELATED APPLICATION

This is a Division of application Ser. No. 11/386,777 filed Mar. 23, 2006, which is a Continuation Application of International Application No. PCT/JP2004/013906, filed Sep. 24, 2004, which claims priority to Japanese Patent Application Nos. 2003-335691 (filed Sep. 26, 2003) and 2003-339625 (filed Sep. 30, 2003). The contents of the aforementioned application are incorporated herein by reference.

BACKGROUND OF THE INVENTION

1. Field of the Invention

The present invention relates to a projection exposure apparatus used to transfer a mask pattern onto a photosensitive substrate by a lithography process for manufacturing devices such as semiconductor elements, image pickup elements (such as CCDs), liquid crystal display elements or thin film magnetic heads, a cleaning method and a maintenance method for a liquid immersion type projection exposure apparatus, and a device manufacturing method.

2. Description of Related Art

A projection exposure apparatus is used that, when a semiconductor element, etc., is manufactured, transfers the pattern image of a reticle as the mask via a projection optical system to the respective shot regions on a wafer (or glass plate, etc.) that has been coated with resist as the photosensitive substrate. Conventionally, step and repeat system reduction projection type exposure apparatuses (steppers) have been widely used as projection exposure apparatuses, but recently step and scan system projection exposure apparatuses that perform exposure by simultaneously scanning the reticle and the wafer have also been receiving attention.

The shorter the exposure wavelength used is, and the larger the numerical aperture of the projection optical system used is, the higher the resolution of the projection optical system provided on the projection exposure apparatus becomes. For this reason, the exposure wavelength used in the projection exposure apparatus has become shorter year by year in association with miniaturization of integrated circuits, and the numerical aperture of the projection optical system is also increasing. In addition, the mainstream exposure wavelength at present is the 248 nm of a KrF excimer laser, but a shorter wavelength, the 193 nm of an ArF excimer laser, is also coming into practical application.

In addition, when exposure is performed, the depth of focus (DOF) is also important as well as the resolution. The resolution R and the depth of focus δ are expressed by the respective equations below.

$$R = k_1 \cdot \lambda/NA, \quad (1)$$

$$\delta = \pm k_2 \cdot \lambda/NA^2, \quad (2)$$

Here, δ is the exposure wavelength, NA is the numerical aperture of the projection optical system, and $k_1$ and $k_2$ are process coefficients. Based on Equation (1) and Equation (2), it is apparent that when the exposure wavelength λ is made shorter and the numerical aperture NA is made larger in order to enhance the resolution R, the depth of focus δ becomes narrower. Conventionally, in projection exposure apparatuses, exposure has been performed by aligning the surface of the wafer with the image plane of the projection optical system using an autofocus system, but for this purpose it is necessary that the depth of focus δ be broad to a certain extent. Therefore, in the past as well, there have been proposals to essentially broaden the depth of focus, such as the phase shift reticle method, the modified illumination method, and the multilayer resist method.

As mentioned above, in conventional projection exposure apparatuses, the depth of focus is becoming narrower due to shorter wavelength of the exposure light and larger numerical aperture of the projection optical system. In addition, in order to handle further high integration of semiconductor integrated circuits, even shorter exposure wavelengths are being researched, and with the current situation there is concern that the depth of focus will become too narrow, and the margin during the exposure operation will be insufficient.

Therefore, the liquid immersion method has been proposed as a method of essentially shortening the exposure wavelength and broadening the depth of focus. In liquid immersion type projection exposure apparatuses that use this liquid immersion method, the space between the lower surface of the projection optical system and the wafer surface is filled with a liquid such as water or an organic solvent, and the fact that the wavelength of the exposure light in liquid becomes 1/n in air (n is normally approximately 1.2 to 1.6 at the refractive index of the liquid) is used to increase the resolution while expanding the depth of focus (for example, see Japanese Unexamined Patent Application, First Publication No. H10-303114, and PCT International Publication No. 99/49504).

In liquid immersion type projection exposure apparatuses, there is a possibility that impurities dissolved in the liquid will precipitate and accumulate in the piping and/or at the front end portion of the projection optical system, which comes into contact with the liquid, leading to deterioration of performance as a liquid immersion type exposure apparatus. Particularly, the fluorite ($CaF_2$) and barium fluoride ($BaF_2$), for example, that can be used as the lens material at ultraviolet wavelengths may be eroded, if purified water or an aqueous solution is used as the liquid due to the solubility thereof, and the concentration of calcium ions and barium ions, known as the scale component, in the liquid increases, and, as a result, due to precipitation and accumulation of the scale, there is a possibility that deterioration of performance as a liquid immersion type exposure apparatus would accelerate.

In addition, minute solid matter consisting of metal salts such as calcium, magnesium, iron, nickel, chrome, etc., and minute solid matter consisting of resins such as PTFE (polytetrafluoroethylene) may be included in the liquid used as the liquid immersion type projection exposure apparatus. These are also extremely low quantity impurity components included in the liquid itself, and are also components that form the piping, etc., that form the flow paths through which the liquid flows.

These components consisting of metal salts accumulate and grow on the walls, etc., of the liquid flow path over a long period of time and become an extremely small solid matter, and when growth proceeds further, it peeled and fell off from the walls of the liquid flow path, and it mixed into the liquid as minute solid matter. PTFE, which is considered to be relatively stable, can be collided by the minute solid matter consisting of metal salts and can itself become new minute solid matter.

SUMMARY OF THE INVENTION

The purpose of the present invention is to prevent performance deterioration of the projection exposure apparatus that has applied the liquid immersion method.

The projection exposure apparatus of this invention is a projection exposure apparatus in which a mask is illuminated with an exposure beam and transfers a pattern of the mask onto a substrate via a projection optical system and a liquid is filled in a space between a surface of the substrate and a optical element of the projection optical system on the substrate side, the apparatus including: a liquid supply and discharge mechanism, which supplies the liquid via a liquid supply tube and recovers the liquid via a liquid recovery tube, and a scale adhesion prevention mechanism provided on the liquid supply tube.

According to the projection exposure apparatus of this invention, it is possible to prevent the adhesion of scale by means of the scale adhesion prevention mechanism provided on the supply tube that supplies the prescribed liquid to the space between the surface of the substrate and the optical element of the projection optical system on the substrate side. Therefore, for example, it is possible to prevent the flow of liquid from worsening due to accumulation of scale such as impurities dissolved in the prescribed liquid on the inner walls of the supply tube, for example, and to stably supply liquid.

In addition, the projection exposure apparatus of this invention further includes a scale adhesion prevention mechanism provided on the liquid recovery tube. According to the projection exposure apparatus of this invention, a scale adhesion prevention mechanism is also provided on the liquid recovery tube, so it is possible to efficiently prevent deterioration of the performance of the projection exposure apparatus due to scale adhesion and to stabilize the performance of the projection exposure apparatus.

In addition, in the projection exposure apparatus of this invention, the scale adhesion prevention mechanism prevents an adhesion of scale based on an external magnetic field applied from an outside of the liquid supply tube or from the outside of the liquid recovery tube. According to the projection exposure apparatus of this invention, electronic excitation action is generated by causing the prescribed liquid to cross the lines of magnetic force resulting from an external magnetic field applied from the outside, for example, a magnet provided on the outer wall of the liquid supply tube or the liquid recovery tube, and it is possible to prevent the adhesion of scale using this electronic excitation action.

In addition, in the projection exposure apparatus of this invention, the scale adhesion prevention mechanism prevents an adhesion of scale based on the electrical signals that flow through wiring wound in a coil shape on the liquid supply tube or the liquid recovery tube. According to the projection exposure apparatus of this invention, electronic excitation action is generated by causing the prescribed liquid to cross the lines of magnetic force resulting from the magnetic field generated by the electrical signals, in other words, electrical current, flowing in the wiring wound in a coil shape, and the adhesion of scale is prevented using this electronic excitation action.

Also, in the projection exposure apparatus of this invention, the exposure beam is ArF laser light. According to the projection exposure apparatus of this invention, it is possible to achieve high resolution and to appropriately expose finely integrated circuit patterns by using ArF laser light.

In addition, in the projection exposure apparatus of this invention, the base material of the optical element is fluorite. According to the projection exposure apparatus of this invention, due to the fact that fluorite is used as the base material of the optical element, it is possible to reliably cause an exposure beam with a short wavelength, for example, ArF laser light, to pass through.

The projection exposure apparatus of this invention is a liquid immersion type projection exposure apparatus in which a gap between an optical component and an object of exposure is filled with a liquid and the object is exposed, the apparatus including: a liquid supply mechanism which supplies the liquid, and a cleaning means that removes adhering substances within a flow path of the liquid. According to the projection exposure apparatus of this invention, it is possible to provide an excellent projection exposure apparatus capable of maintaining the desired performance even in usage continuing over a long period of time.

In the projection exposure apparatus of this invention, the cleaning means has a supply flow volume ascertainment unit, which ascertains a liquid supply flow volume per unit time, and a flow volume fluctuation control unit for causing a liquid supply flow volume per unit time to fluctuate.

The projection exposure apparatus of this invention further includes a liquid discharge mechanism which discharges the liquid from the space filled with the liquid, and the cleaning means has a discharge flow volume ascertainment unit, which ascertains the liquid discharge flow volume per unit time, and a flow volume fluctuation control unit for causing the liquid discharge flow volume per unit time to fluctuate, and the flow volume fluctuation control unit controls the liquid supply mechanism and the liquid discharge mechanism so that the liquid supply flow volume per unit time and the liquid discharge flow volume per unit time are linked and caused to fluctuate.

In the projection exposure apparatus of this invention, the liquid supply flow volume per unit time fluctuates at amplitude of 0.1% or more with respect to a time average value of the liquid supply flow volume.

The projection exposure apparatus of this invention includes a function of removing the adhering substances from inside of the flow path by mixing one or more bubbles of a volume of 1 ml or less into the liquid using the cleaning means.

The projection exposure apparatus of this invention is configured to operate the cleaning means in correspondence with a stop of exposure so as to remove the adhering substances from the inside of the flow path.

In the projection exposure apparatus of this invention, the optical component may be made of a synthetic calcium fluoride monocrystal. In the projection exposure apparatus of this invention, an uppermost surface of the optical component may be coated with magnesium fluoride. In the projection exposure apparatus of this invention, purified water or an aqueous solution in which salts is dissolved may be used as the liquid.

The cleaning method of the projection exposure apparatus of this invention is a cleaning method of a liquid immersion type projection exposure apparatus in which a gap between an optical component and an object of exposure is filled with a liquid and the object subject is exposed; the method including: causing, when supplying the liquid, a liquid supply flow volume and a liquid discharge flow volume to fluctuate to remove an adhering substances in the flow path of the liquid. According to the cleaning method of the projection exposure apparatus of this invention, it is possible to provide an excellent cleaning method of a liquid immersion type projection exposure apparatus capable of maintaining the desired performance even in usage continuing over a long period of time.

In cleaning method of the projection exposure apparatus of this invention, the adhering substances in the flow path of the liquid are removed by causing fluctuation at an amplitude of 0.1% or more for the liquid supply volume per unit time with respect to a time average value of the liquid supply flow volume.

The cleaning method of the projection exposure apparatus of this invention is a cleaning method of a liquid immersion type projection exposure apparatus in which a gap between an optical component and an object of exposure is filled with a liquid and the object is exposed, the method including: mixing, when supplying the liquid, one or more bubbles of a volume of 1 ml or less into the liquid to clean inside of a flow path of the liquid. According to the cleaning method of the projection exposure apparatus of this invention, it is possible to provide an excellent cleaning method of a liquid immersion type projection exposure apparatus that is capable of maintaining the desired performance.

The projection exposure apparatus of the present invention is a projection exposure apparatus in which a space between a first object and a second object is filled with a liquid and exposure light is projected on an object of exposure via the liquid, the apparatus including a liquid supply and discharge mechanism which supplies liquid via a liquid supply tube and recovers liquid via a liquid recovery tube, and an adhesion prevention mechanism which prevents an adhesion of impurities to a member that forms a flow path of the liquid.

According to the projection exposure apparatus of this invention, it is possible to prevent impurities from mixing into the liquid and to prevent the flow of liquid from worsening, and it is possible to maintain performance as a liquid immersion type projection exposure apparatus.

In addition, the projection exposure apparatus of this invention is a liquid immersion type projection exposure apparatus in which a space between a first object and a second object is filled with a liquid and exposure light is projected on an object of exposure via the liquid, the apparatus including: a liquid supply mechanism which supplies liquid, a liquid discharge mechanism which discharges liquid, and a cleaning mechanism that cleans a flow path of the liquid. According to the projection exposure apparatus of this invention, it is possible to prevent the mixing of impurities into the liquid and to prevent the liquid flow from worsening, and it is possible to maintain performance as a liquid immersion type projection exposure apparatus.

The maintenance method of the projection exposure apparatus of this invention is a maintenance method of a liquid immersion type projection exposure apparatus in which a gap between a first object and a second object is filled with a liquid and an object of exposure is exposed, the method including: cleaning a flow path of the liquid, when exposure of the object is not being performed.

According to the maintenance method of this invention, the flow path of the liquid is cleaned without affecting exposure of the object to prevent the mixing of impurities into the liquid and the liquid flow from worsening, and it is possible to maintain the performance of the liquid immersion type projection exposure apparatus. In addition, through the device manufacturing method of this invention, it is possible to use the projection exposure apparatus or maintenance method described above to manufacture an excellent device with good yield.

DETAILED DESCRIPTION OF THE INVENTION

Figure 1:
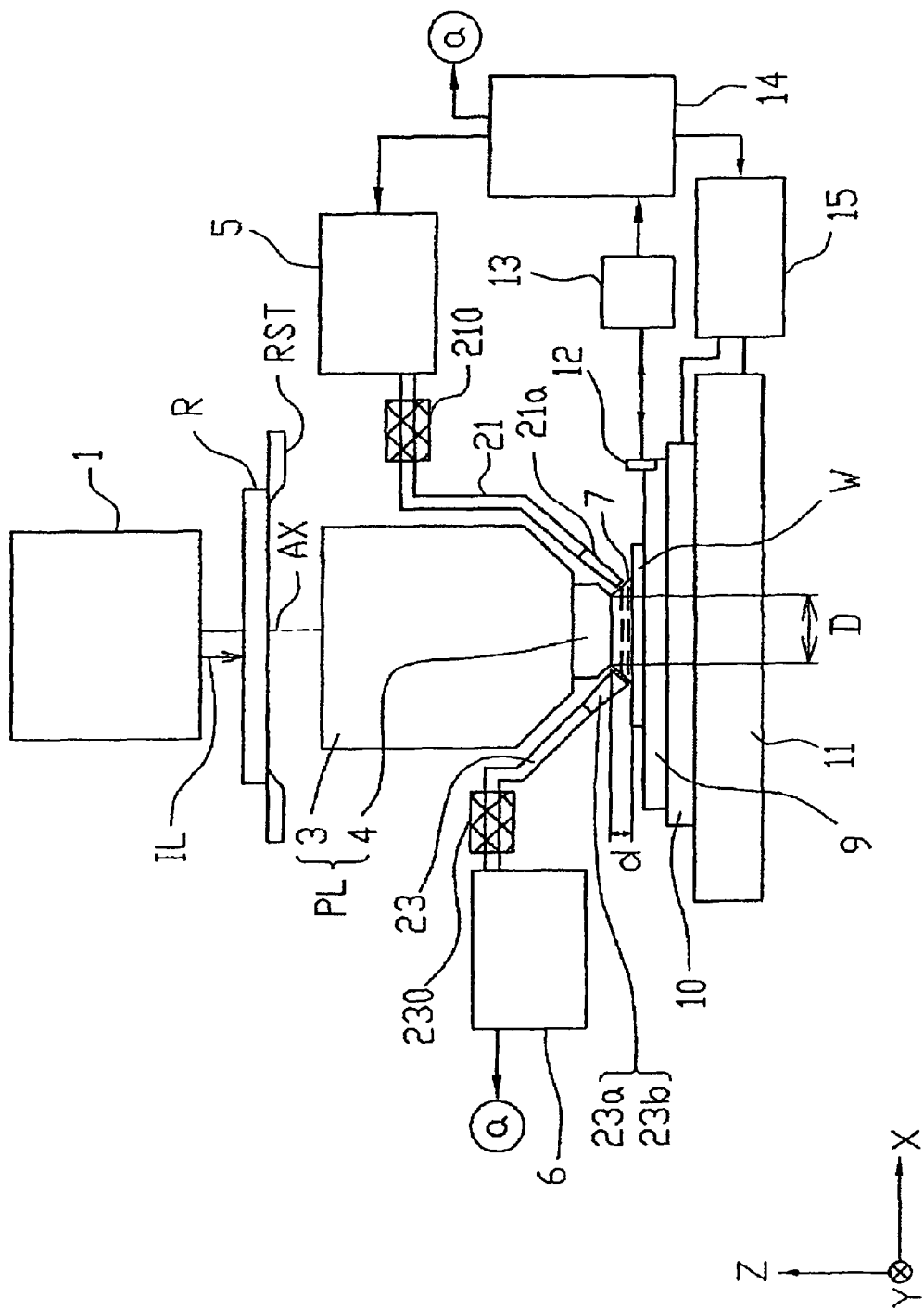
FIG. 1 is a drawing that shows the schematic configuration of the projection exposure apparatus used in the first embodiment.

The projection exposure apparatus relating to the first embodiment of the present invention will be explained below while referring to the drawings. FIG. 1 is a drawing that shows the schematic configuration of a step and repeat system projection exposure apparatus relating to the first embodiment. In addition, in the following explanation, the XYZ rectangular coordinate system shown in FIG. 1 is set up, and the positional relationship of the respective members will be explained while referring to this XYZ rectangular coordinate system. The XYZ rectangular coordinate system is such that the X axis and the Y axis are set to be parallel to the wafer W, and the Z axis is set to a direction orthogonal to the wafer W. The XYZ coordinate system in the figure is such that the XY plane is actually set to be a surface that is parallel to the horizontal plane, and the Z axis is set in the vertical direction.

As shown in FIG. 1, the projection exposure apparatus relating to this embodiment includes an illumination optical system 1 that includes an ArF excimer laser light source, which is the exposure light source, configured by an optical integrator (homogenizer), a field diaphragm, a condenser lens, etc. The exposure light (exposure beam) IL that consists of ultraviolet pulse light with a wavelength of 193 nm that has exited from the light source passes through the illumination optical system 1 and illuminates the pattern provided on a reticle (mask) R. The light that has passed through the reticle R performs reduction projection exposure at the prescribed projection magnification β (for example, β is ¼, ⅕, etc.) via a two-sided (or one-sided on the wafer W side) telecentric projection optical system PL in the exposure region on a wafer (substrate) W on which a photoresist has been coated.

Note that KrF excimer laser light (248 nm wavelength), $F_2$ laser light (157 nm wavelength), or a mercury lamp i-beam (365 nm wavelength) may be used as the exposure light IL.

In addition, the reticle R is held on a reticle stage RST, and a mechanism that performs fine movement of the reticle R in the X direction, the Y direction and the rotation direction is incorporated into the reticle stage RST. The reticle stage RST is such that the position in the X direction, the Y direction and the rotation direction is measured by a reticle laser interferometer (not shown in the drawing) and controlled in real time.

In addition, the wafer W is held on the Z stage 9 by means of a wafer holder (not shown in the drawing). The Z stage 9 is secured on the XY stage 10 that moves along an XY plane essentially parallel to the image plane of the projection optical system PL, and it controls the wafer W focus position (position in the Z direction) and angle of inclination. The Z stage 9 is such that the position in the X direction, the Y direction and the rotation direction is measured by a wafer laser interferometer 13 that uses a movable mirror 12 positioned on the Z stage 9, and controlled in real time. In addition, the XY stage 10 is mounted on a base 11, and it controls the X direction, the Y direction and the rotation direction of the wafer W.

A main control system 14 provided on this projection exposure apparatus performs adjustment of the position of the reticle R in the X direction, the Y direction and the rotation direction based on the measured value measured by the reticle laser interferometer. That is, the main control system 14 performs adjustment of the position of the reticle R by sending control signals to a mechanism incorporated into the reticle stage RST and performing fine movement of the reticle stage RST.

In addition, the main control system 14 performs adjustment of the focus position (position in the Z direction) and the angle of inclination of the wafer W in order to match the surface on the wafer W with the image plane of the projection optical system PL by means of an autofocus system and an autoleveling system. Specifically, the main control system 14 performs adjustment of the focus position and the angle of inclination of the wafer W by sending control signals to the wafer stage drive system 15 and driving the Z stage 9 by means of the wafer stage drive system 15. In addition, the main control system 14 performs adjustment of the position of the wafer W in the X direction, the Y direction and the rotation direction based the measurement value measured by the wafer laser interferometer 13. That is, the main control system 14 performs adjustment of the position of the wafer W in the X direction, the Y direction and the rotation direction by sending control signals to a wafer stage drive system 15 and driving the XY stage 10 by means of the wafer stage drive system 15.

The main control system 14 sequentially step moves the respective shot regions on the wafer W to the exposure position by sending control signals to the wafer stage drive system 15 and driving the XY stage 10 by means of the wafer stage drive system 15. Specifically, the operation of exposing the pattern image of the reticle R on the wafer W is repeated by a step and repeat system.

In this projection exposure apparatus, the liquid immersion method is employed in order to effectively shorten the exposure wavelength and improve resolution. Here, in the liquid immersion type projection exposure apparatus that applies the liquid immersion method, the space between the surface of the wafer W and the front end surface (lower surface) of the optical element 4 of the wafer W side of the projection optical system PL is filled with the prescribed liquid 7 at least while the pattern image of the reticle R is being transferred onto the wafer W. The projection optical system PL includes a lens barrel 3 that accommodates a plurality of optical elements formed of quartz or fluorite that includes the projection optical system PL. In this projection optical system PL, the configuration is such that the optical element 4 that is most on the wafer W side is formed of fluorite, and only the front end portion 4A (see FIG. 2) of the wafer W side of the optical element 4 comes into contact with the liquid 7. Through this, corrosion, etc., of the lens barrel 3 consisting of metal is prevented.

Here, the base material of the optical element 4 is fluorite, and magnesium fluoride ($MgF_2$) is formed as a dissolution prevention film by the vacuum deposition method on the front end portion 4A of the optical element 4, that is, the portion that comes into contact with the liquid 7. In addition, purified water, which can be easily obtained at semiconductor manufacturing plants, etc., is used as the liquid 7.

Figure 2:
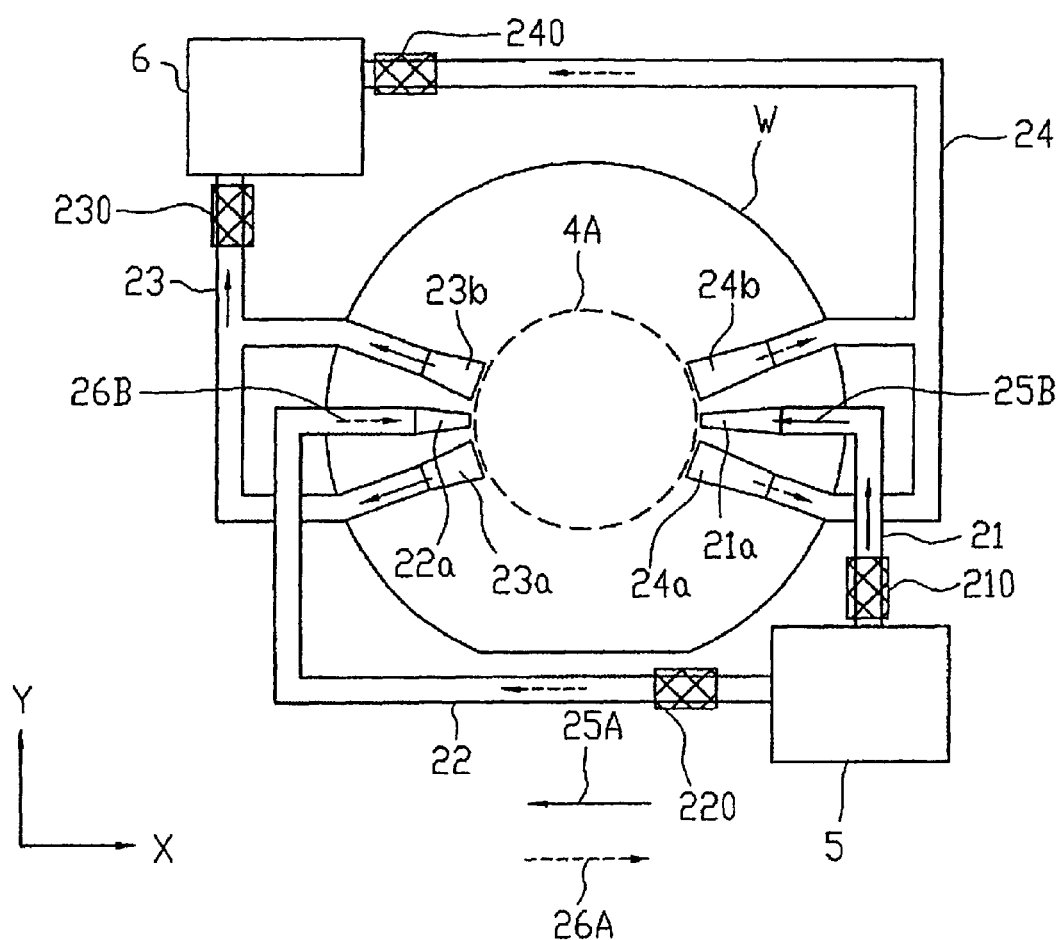
FIG. 2 is a drawing that shows the positional relationship of the front end portion of the optical element of the projection optical system and the discharge nozzle and inflow nozzle for the X direction relating to the first embodiment.
Figure 3:
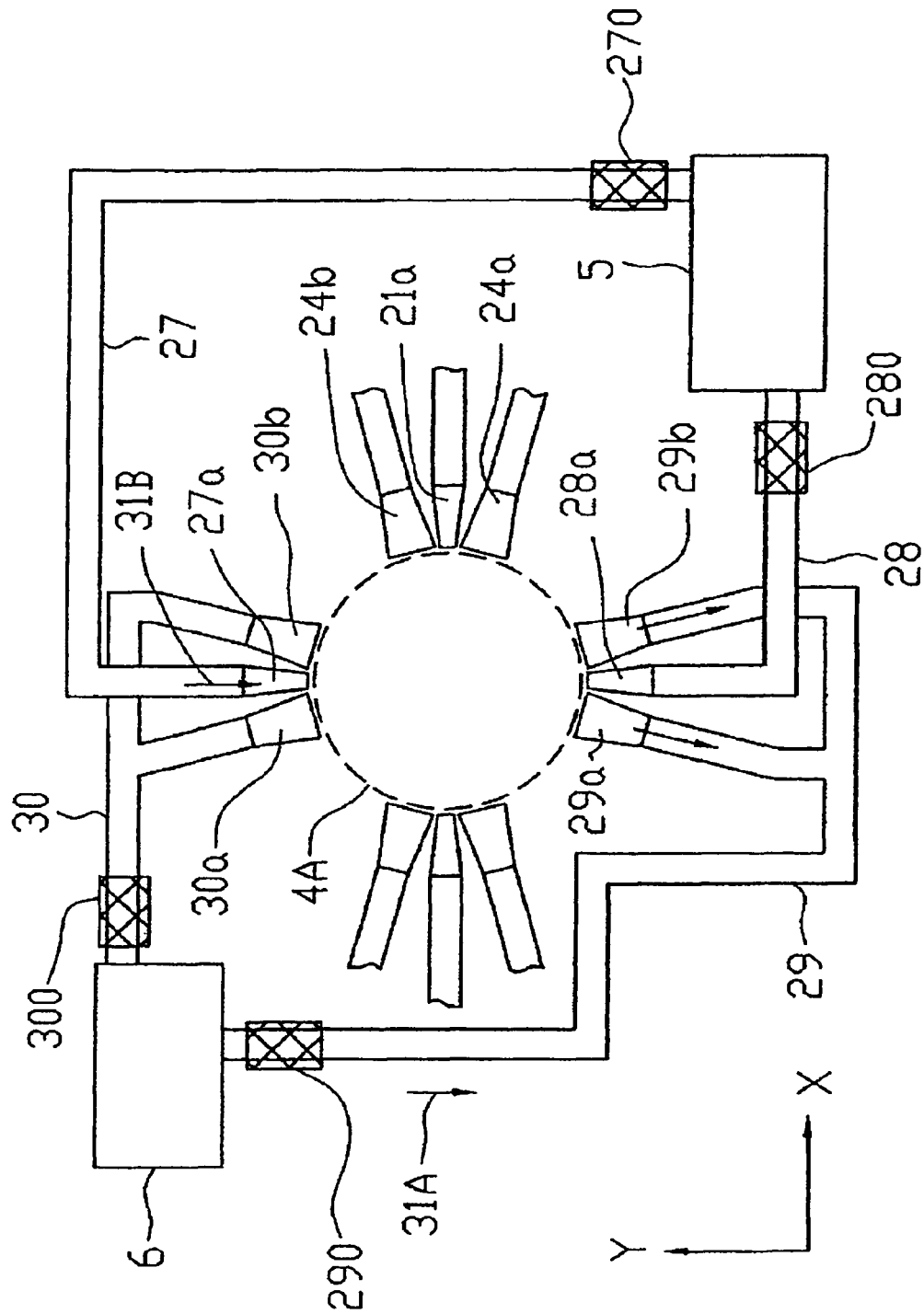
FIG. 3 is a drawing that shows the positional relationship between the front end portion of the optical element of the projection optical system and the discharge nozzle and inflow nozzle that perform supply and recovery of liquid from the Y direction relating to the first embodiment.

FIG. 2 is a drawing that shows the positional relationship of the front end portion 4A of the optical element 4 of the projection optical system PL, the wafer W and the two pairs of discharge nozzles and inflow nozzles between which the front end portion 4A is interposed in the X direction. In addition, FIG. 3 is a drawing that shows the positional relationship of the front end portion 4A of the optical element 4 of the projection optical system PL and the two pairs of discharge nozzles and inflow nozzles between which the front end portion 4A is interposed in the Y direction. The projection exposure apparatus relating to this embodiment includes a liquid supply apparatus 5 that controls supply of the liquid 7 and a liquid recovery apparatus 6 that controls discharge of the liquid 7.

The liquid supply apparatus 5 includes a tank for the liquid 7 (not shown in the drawing), a pressurizing pump (not shown in the drawing), and a temperature control apparatus (not shown in the drawing), etc. In addition, as shown in FIG. 2, a discharge nozzle 21a, which has a narrow front end portion on the +X direction side of the front end portion 4A, is connected to the liquid supply apparatus 5 via a supply tube 21, and a discharge nozzle 22a, which has a narrow front end portion on the −X direction side of the front end portion 4A, is connected to the liquid supply apparatus 5 via a supply tube 22. A scale adhesion prevention mechanism 210 that prevents scale, which is impurities dissolved in the liquid 7, from adhering to the supply tube 21 and the nozzle 21a, etc., is provided on the supply tube 21, and, in the same way, a scale adhesion prevention mechanism 220 is provided on the supply tube 22. In addition, as shown in FIG. 3, a discharge nozzle 27a, which has a narrow front end portion on the +Y direction side of the front end portion 4A, is connected to the liquid supply apparatus 5 via a supply tube 27, and a discharge nozzle 28a, which has a narrow front end portion on the −Y direction side of the front end portion 4A, is connected to the liquid supply apparatus 5 via a supply tube 28. A scale adhesion prevention mechanism 270 that prevents scale, which is impurities dissolved in the liquid 7, from adhering to the supply tube 27 and the nozzle 27a, etc., is provided on the supply tube 27, and, in the same way, a scale adhesion prevention mechanism 280 is provided on the supply tube 28. The liquid supply apparatus 5 adjusts the temperature of the liquid 7 by means of the temperature control apparatus and supplies the liquid 7 whose temperature has been adjusted onto the wafer W from at least one discharge nozzle from among the discharge nozzles 21a, 22a, 27a, 28a via at least one supply tube among the supply tubes 21, 22, 27, 28. Note that, using the temperature control apparatus, the temperature of the liquid 7 is set to the same level as the temperature inside the chamber in which the projection exposure apparatus relating to this embodiment is accommodated, for example. In addition, the liquid supply apparatus 5 of the exposure apparatus does not necessarily need to include all of the tank, the pressurizing pump and the temperature control apparatus, and at least a part of these may be substituted with equipment of the plant, etc., where to exposure apparatus is installed.

The liquid recovery apparatus 6 includes a tank for the liquid 7 (not shown in the drawing), a suction pump (not shown in the drawing), etc. In addition, as shown in FIG. 2, inflow nozzles 23a, 23b, which have a wide front end portion on the −X direction side of the front end portion 4A, is connected to the liquid recovery apparatus 6 via recovery tube 23, and inflow nozzles 24a, 24b, which have a wide front end portion on the +X direction side of the front end portion 4A, is connected to the liquid recovery apparatus 6 via recovery tube 24. Note that the inflow nozzles 23a, 23b, 24a, 24b are arranged in a form that opens in a fan shape with respect to an axis that passes through the center of the front end portion 4A and is parallel to the X axis. A scale adhesion prevention mechanism 230 that prevents scale, which is impurities dissolved in the liquid 7, from adhering to the recovery tube 23 and nozzles 23a, 23b etc., is provided on the recovery tube 23, and, in the same way, a scale adhesion prevention mechanism 240 is provided on the recovery tube 24. In addition, as shown in FIG. 3, inflow nozzles 29a, 29b, which have a wide front end portion on the −Y direction side of the front end portion 4A, is connected to the liquid recovery apparatus 6 via recovery tube 29, and inflow nozzles 30a, 30b, which have a wide front end portion on the +Y direction side of the front end portion 4A, is connected to the liquid recovery apparatus 6 via recovery tube 30. Note that the inflow nozzles 29a, 29b, 30a, 30b are arranged in a form that opens in a fan shape with respect to an axis that passes through the center of the front end portion 4A and is parallel to the Y axis. A scale adhesion prevention mechanism 290 that prevents scale, which is impurities dissolved in the liquid 7, from adhering to the recovery tube 29 and nozzles 29a, 29b, etc., is provided on the recovery tube 29, and, in the same way, a scale adhesion prevention mechanism 300 is provided on the recovery tube 30.

The liquid recovery apparatus 6 recovers the liquid 7 from the surface of the wafer W from at least one inflow nozzle from among the inflow nozzles 23a and 23b, 24a and 24b, 29a and 29b and 30a and 30b via at least one recovery tube among the recovery tubes 23, 24, 29, 30. Note that liquid recovery apparatus 6 of the exposure apparatus does not necessarily need to include a tank and a suction pump, and at least one of these may be substituted with equipment of the plant, etc., where the exposure apparatus is installed.

Next, the liquid 7 supply and recovery methods will be explained. In FIG. 2, when the wafer W is step-moved in the direction of arrow 25A (the −X direction) shown by the solid line, the liquid supply apparatus 5 supplies the liquid 7 to the space between the front end portion 4A of the optical element 4 and the wafer W via the supply tube 21 and the discharge nozzle 21a. The liquid recovery apparatus 6 recovers the liquid 7, which is supplied to the space between the front end portion 4A and the wafer W by the liquid supply apparatus 5, from the surface of the wafer W via the recovery tube 23 and inflow nozzles 23a, 23b. In this case, the liquid 7 flows on top of the wafer W in the direction of arrow 25B (the −X direction), and the space between the wafer W and the optical element 4 is stably filled with the liquid 7.

On the other hand, in FIG. 2, when the wafer W is step-moved in the direction of arrow 26A (the +X direction) shown by the dashed line, the liquid supply apparatus 5 supplies the liquid 7 to the space between the front end portion 4A of the optical element 4 and the wafer W via the supply tube 22 and the discharge nozzle 22a. The liquid recovery apparatus 6 recovers the liquid 7, which is supplied to the space between the front end portion 4A and the wafer W by the liquid supply apparatus 5, via the recovery tube 24 and inflow nozzles 24a, 24b. In this case, the liquid 7 flows on the surface of the wafer W in the direction of arrow 26B (the +X direction), and the space between the wafer W and the optical element 4 is stably filled with the liquid 7.

In addition, when the wafer W is step-moved in the Y-direction, supply and recovery of the liquid 7 is performed in the Y direction. That is, in FIG. 3, when the wafer W is step-moved in the direction of arrow 31A (the −Y direction) shown by the solid line, the liquid supply apparatus 5 supplies the liquid 7 via the supply tube 27 and the discharge nozzle 27a. The liquid recovery apparatus 6 recovers the liquid 7, which is supplied to the space between the front end portion 4A and the wafer W by the liquid supply apparatus 5, via the recovery tube 29 and inflow nozzles 29a, 29b. In this case, the liquid 7 flows on top of the exposure region just below the front end portion 4A of the optical element 4 in the direction arrow 31B (the −Y direction).

In addition, when the wafer W is step-moved in the +Y direction, the liquid supply apparatus 5 supplies the liquid 7 via the supply tube 28 and the discharge nozzle 28a. The liquid recovery apparatus 6 recovers the liquid 7, which is supplied to the space between the front end portion 4A and the wafer W by the liquid supply apparatus 5, via the recovery tube 30 and inflow nozzles 30a, 30b. In this case, the liquid 7 flows on top of the exposure region just below the front end portion 4A of the optical element 4 in the +Y direction.

Note that not only nozzles that perform supply and recovery of the liquid 7 from the X direction or the Y direction but a nozzle for supplying and recovering the liquid 7 from the diagonal direction may be provided.

Figure 4:
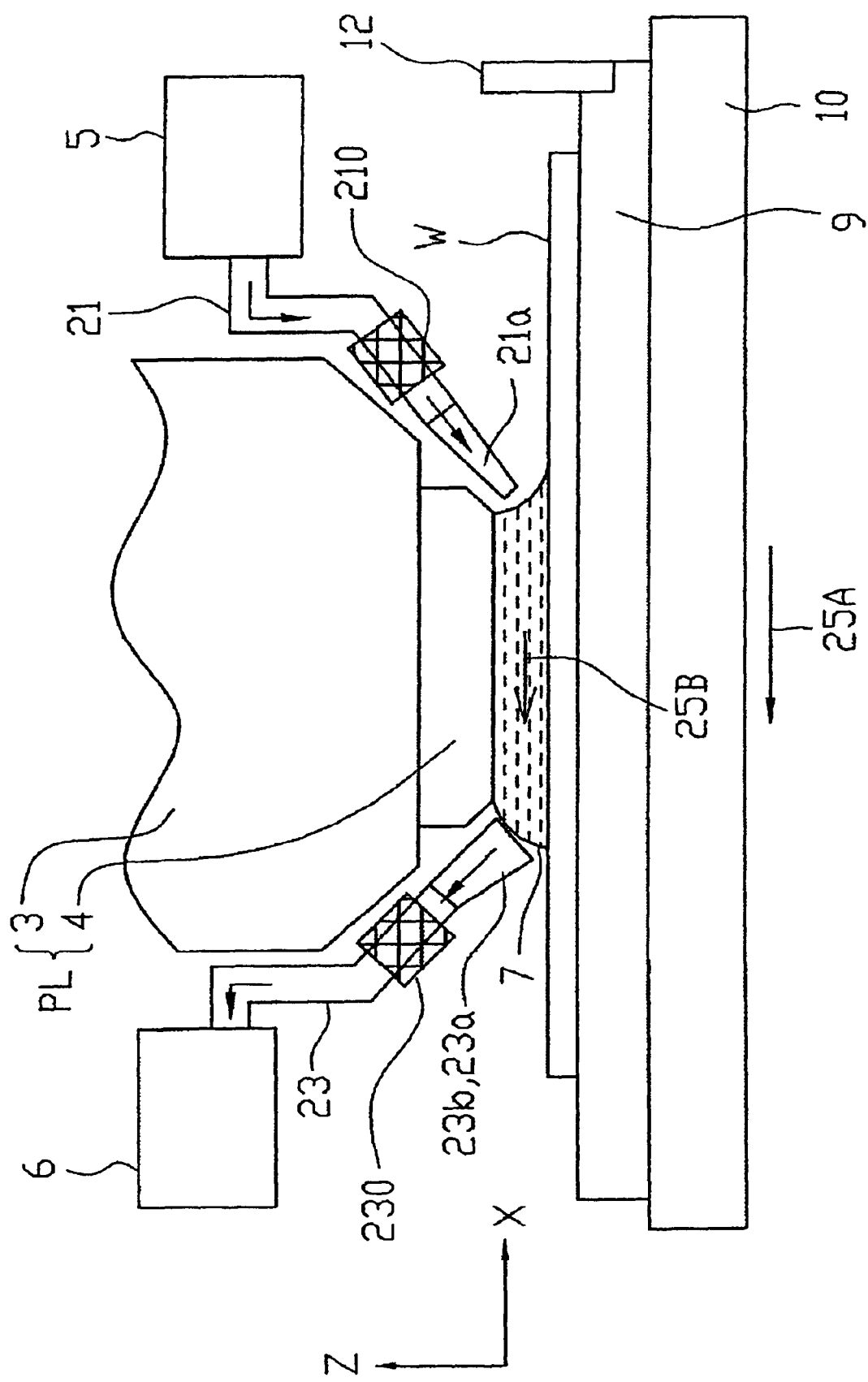
FIG. 4 is an enlarged diagram of the principal portion that shows the condition of supply and recovery of the liquid between the optical element and the wafer relating to the first embodiment.

Next, the liquid 7 supply volume and recovery volume control method will be explained. FIG. 4 is a drawing that shows the status in which supply and recovery of the liquid 7 to/from the space between the optical element 4 that constitutes the projection optical system PL and the wafer W are being performed. As shown in FIG. 4, when the wafer W moves in the direction (−X direction) of arrow 25A, the liquid 7 supplied from the discharge nozzle 21a flows in the direction of arrow 25B (−X direction) and is recovered by the inflow nozzles 23a, 23b. During the wafer W is moving, the supply amount $Vi(m^3/s)$ and the recovery amount $Vo(m^3/s)$ of the liquid 7 are made equal so that the amount of liquid 7 filled between the optical element 4 and the wafer W is maintained to be constant. In addition, the supply amount Vi and the recovery amount Vo of the liquid 7 are adjusted based on the velocity of movement v of the XY stage 10 (wafer W). Specifically, the supply amount Vi and the recovery amount Vo of the liquid 7 are calculated based on Equation 1.

$$Vi = Vo = D \cdot v \cdot d \qquad \text{(Equation 1)}$$

Here, "D" is the diameter (m) of the front end portion 4A of the optical element 4 as shown in FIG. 1, "v" is the velocity of movement (m/s) of the XY stage 10, and "d" is the operating distance (working distance) (m) of the projection optical system PL. The velocity v when the XY stage 10 is step-moved is set by the main control system 14, and D and d are input in advance, so by calculating and adjusting the supply amount Vi and the recovery amount Vo of the liquid 7 based on Equation 1, the liquid 7 is always filled in the space between the optical element 4 and the wafer W.

Note that it is preferable that the operating distance d of the projection optical system PL be as narrow as possible in order to cause the liquid 7 to exist stably between the optical element 4 and the wafer W. For example, the operating distance d of the projection optical system PL is set to approximately 2 mm.

Next, an operation to prevent adhesion of scale when supplying and recovering the liquid 7 will be explained. By performing supply and recover of the liquid 7, there are cases where scale, which is impurities dissolved in the liquid 7, adheres to the inner walls of the supply tube and the recovery tube, causing the performance of the projection exposure apparatus to drop. Impurities such as calcium dissolved in a liquid such as water are positively charged, so they tend to be attached to the inner walls of the supply tube and the recovery tube, which are easy to be negatively charged. Therefore, the amount of scale attached to the inner walls of the supply tube and the recovery tube increases as time goes by, and when it adheres, the performance of the projection exposure apparatus drops. For example, due to scale accumulating (adhering) on the inner walls of the supply tube and the recovery tube, there is a possibility of the liquid flow worsening, and due to scale accumulating (adhering) in the nozzles that supply and recover liquid, there is a possibility of the nozzle clogging. In addition, there is a possibility that deterioration of optical performance will be caused by scale accumulating (adhering) to the front end portion of the projection optical system that the liquid comes into contact with.

Therefore, in this embodiment, the surface electrical potential when the dissolved impurities scale crystallize is neutrally or negatively charged, so that scale crystallization is restricted, and accumulation is prevented by the repulsive force of the electric charge. That is, by ion-enclosing the scale component and making the surface electric potential neutral or negative using the hydration energy of the water molecules polarized by the electronic excitation action generated when a magnetic field is applied to the liquid from the outside, it is possible to prevent the adhesion of scale to the supply tube, the recovery tube and the like.

For example, in the scale adhesion prevention mechanism 210, an N pole magnet is arranged at a position that comes into contact with the outer walls of the supply tube 21, and an S pole magnet is arranged at a position that opposes this N pole magnet interposing the supply tube 21. Lines of magnetic force act on the supply tube 21 by means of the magnetic field generated between these two poles. Therefore, when a fluid that has electrical conductivity crosses the magnetic field between these two poles at a right angle at a certain speed or higher, the electronic excitation action occurs, and the energy is generated. Through this generated energy, the surface electrical potential when the scale crystallizes can be neutrally or negatively charged, and it is possible to prevent the adhesion of scale to the supply tube 21, etc. Note that the scale adhesion prevention mechanisms 220, 270 and 280 respectively arranged for the supply tubes 22, 27 and 28 and the scale adhesion prevention mechanisms 230, 240, 290 and 300 respectively arranged for the recovery tubes 23, 24, 29 and 30 both have a configuration that is similar to that of the scale adhesion prevention mechanism 210, and the adhesion of scale is prevented by causing lines of magnetic force to act using magnets in scale adhesion prevention mechanisms 220, 270, 280, 230, 240, 290 and 300 as well.

According to the projection exposure apparatus relating to the first embodiment, because the scale adhesion prevention mechanisms of the supply tube that supplies the liquid are provided respectively, the scale component dissolved in the liquid is neutrally or negatively charged when the liquid flows through the supply tube, and it is possible to prevent scale from adhering to the inner walls of the supply tube or the nozzle, etc. Therefore, it is possible to prevent the flow of liquid from worsening due to the adherence of scale to the inner walls of the supply tube and the recovery tube and to prevent nozzles that supply or discharge liquid from clogging due to scale. Furthermore, it is also possible to prevent optical characteristics from deteriorating due to scale adhering to the front end portion of the projection optical system, so it is possible to stably maintain the performance of the projection exposure apparatus.

In addition, because the scale adhesion prevention mechanisms are respectively provided on the supply tube that supplies liquid to the space between the substrate and the front end portion of the projection optical system and for the recovery tube that recovers the liquid, adhesion and accumulation of scale, which is impurities dissolved in the liquid, on the supply tube, the front end portion of the projection optical system, the respective nozzles, and the recovery tubes, etc., are prevented. Therefore, it is not necessary to stop operation of the apparatus to replace components that have become nonconforming due to the adhesion and accumulation of scale, or it is possible to reduce the frequency of component replacement attributable to the adhesion and accumulation of scale, and thus, it is possible to stably maintain performance as a projection exposure apparatus.

In addition, the index of refraction n of purified water with respect to exposure light with a wavelength of approximately 200 nm is approximately 1.44, so ArF excimer laser light, which has a 193 nm wavelength, is shortened to 1/n, that is, approximately 134 nm, on the wafer W, so high resolution can be obtained. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, so it is possible to further improve resolution.

In addition, according to the projection exposure apparatus relating to this first embodiment, two pairs of discharge nozzles and inflow nozzles that are mutually reversed in the X direction and the Y direction are provided, so it is possible to continue to stably fill the space between the wafer and the optical element with liquid even in the case where the wafer is moved in the +X direction, the −X direction, the +Y direction or the −Y direction.

Also, since liquid flows on the wafer, even in the case where foreign matter adheres on the wafer, that foreign matter can flow away by means of the liquid. In addition, since the liquid is adjusted to the prescribed temperature by means of the liquid supply apparatus, the temperature of the wafer surface also becomes constant, and it is possible to prevent a degradation of an overlay accuracy resulting from thermal expansion of the wafer generated at the time of exposure. Therefore, even in the case where there is a time difference between alignment and exposure such as in EGA (enhanced global alignment) system alignment, it is possible to prevent a degradation of an overlay accuracy resulting from thermal expansion of the wafer.

In addition, through the projection exposure apparatus relating to this first embodiment, since the liquid flows in the same direction as that in which the wafer is moved, it is possible to recover the liquid, that has absorbed impurities and heat, by means of a liquid recovery apparatus without causing it to remain on the exposure region directly under the front end portion of the optical element.

Figure 5:
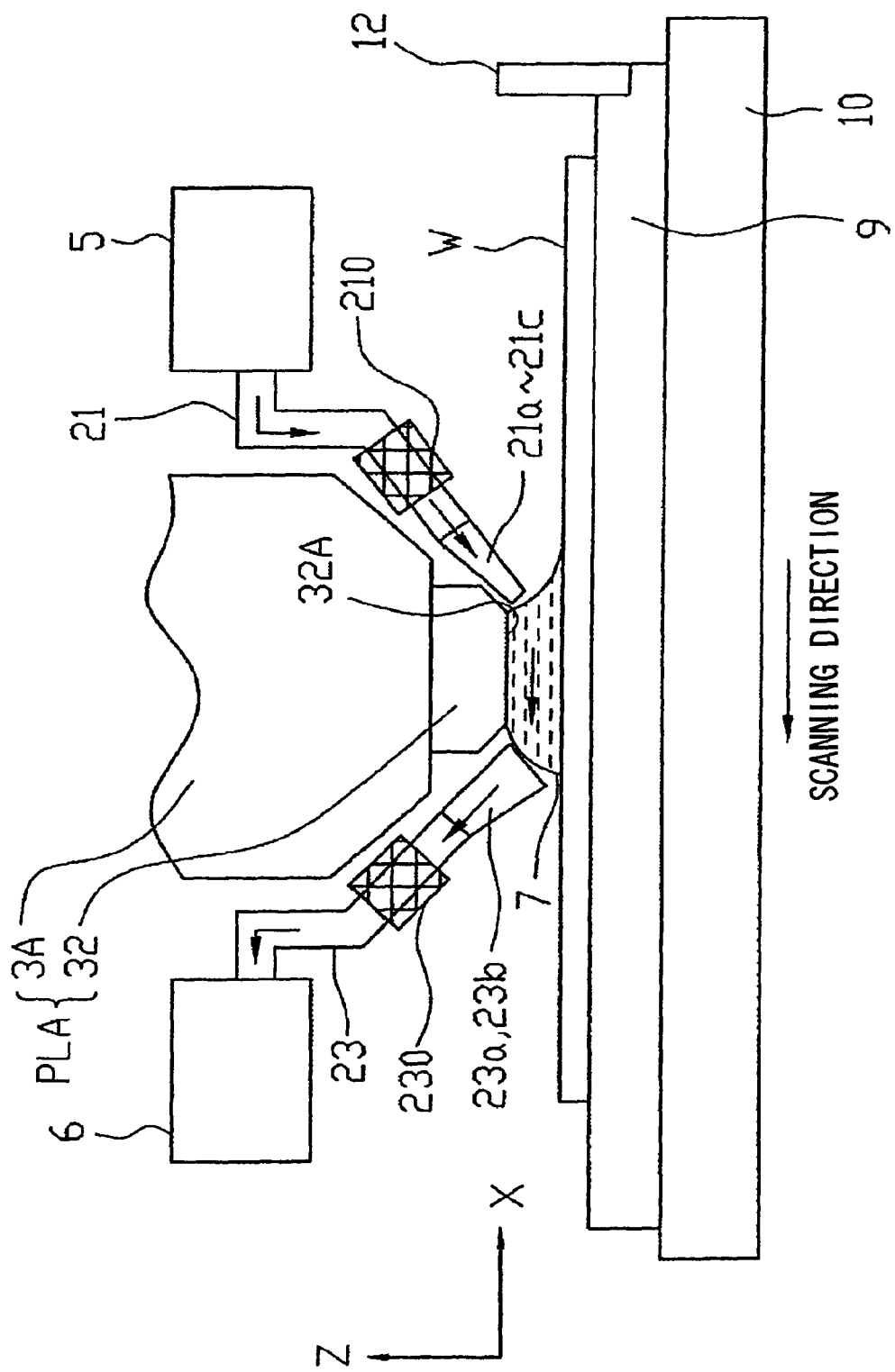
FIG. 5 is a front view that shows the lower end portion of the projection optical system of the projection exposure apparatus used in the second embodiment, the liquid supply apparatus, the liquid recovery apparatus, etc.

Next, the projection exposure apparatus relating to the second embodiment of the present invention will be explained while referring to drawings. FIG. 5 is a front view that shows the lower portion of the projection optical system PLA of the step and scan system projection exposure apparatus relating to the second embodiment, the liquid supply apparatus 5, the liquid recovery apparatus 6, etc. In addition, in the following explanation, the XYZ rectangular coordinate system shown in FIG. 5 is set up, and the positional relationship of the respective members will be explained while referring to this XYZ rectangular coordinate system. The XYZ rectangular coordinate system is such that the X axis and the Y axis are set to be parallel to the wafer W, and the Z axis is set to be orthogonal to the wafer W. The XYZ coordinate system in the figure is such that the XY plane is actually set to be a surface that is parallel to the horizontal plane, and the Z axis is set in the vertical direction. Note that, in FIG. 5, an explanation will be given while assigning the same codes as were used in the first embodiment to the same configurations as the projection exposure apparatus relating to the first embodiment.

In this projection exposure apparatus, the optical element 32 of the lowest end of the lens barrel 3A of the projection optical system PLA is such that the front end portion 32A is cut into a long, narrow rectangle in the Y direction (the non-scanning direction) so as to leave only the portion required for scanning exposure. During scanning exposure, the pattern image of a portion of the reticle is projected to the rectangular exposure region directly below the front end portion 32A, and the wafer W moves in the +X direction (or the −X direction) at a velocity β·V (β is the projection magnification) via the XY stage 10 in synchronization with the reticle (not shown in the drawing) moving in the −X direction (or the +X direction) at a velocity V. Then, after exposure to one shot region has ended, the next shot region moves to the scan start position by means of stepping of the wafer W, and exposure to the respective shot regions is sequentially performed thereafter by a step and scan system.

In addition, the base material of the optical element 32 is fluorite, and magnesium fluoride ($MgF_2$) is formed as a dissolution prevention film formed by the vacuum deposition method on the front end portion 32A of the optical element 32.

In the second embodiment as well, in the same way as in the first embodiment, the liquid immersion method is applied, so the space between the optical element 32 and the surface of the wafer W is filled with the liquid 7 during scanning exposure. Purified water is used as the liquid 7. Supply and recovery of the liquid 7 is respectively performed by the liquid supply apparatus 5 and the liquid recovery apparatus 6.

Figure 6:
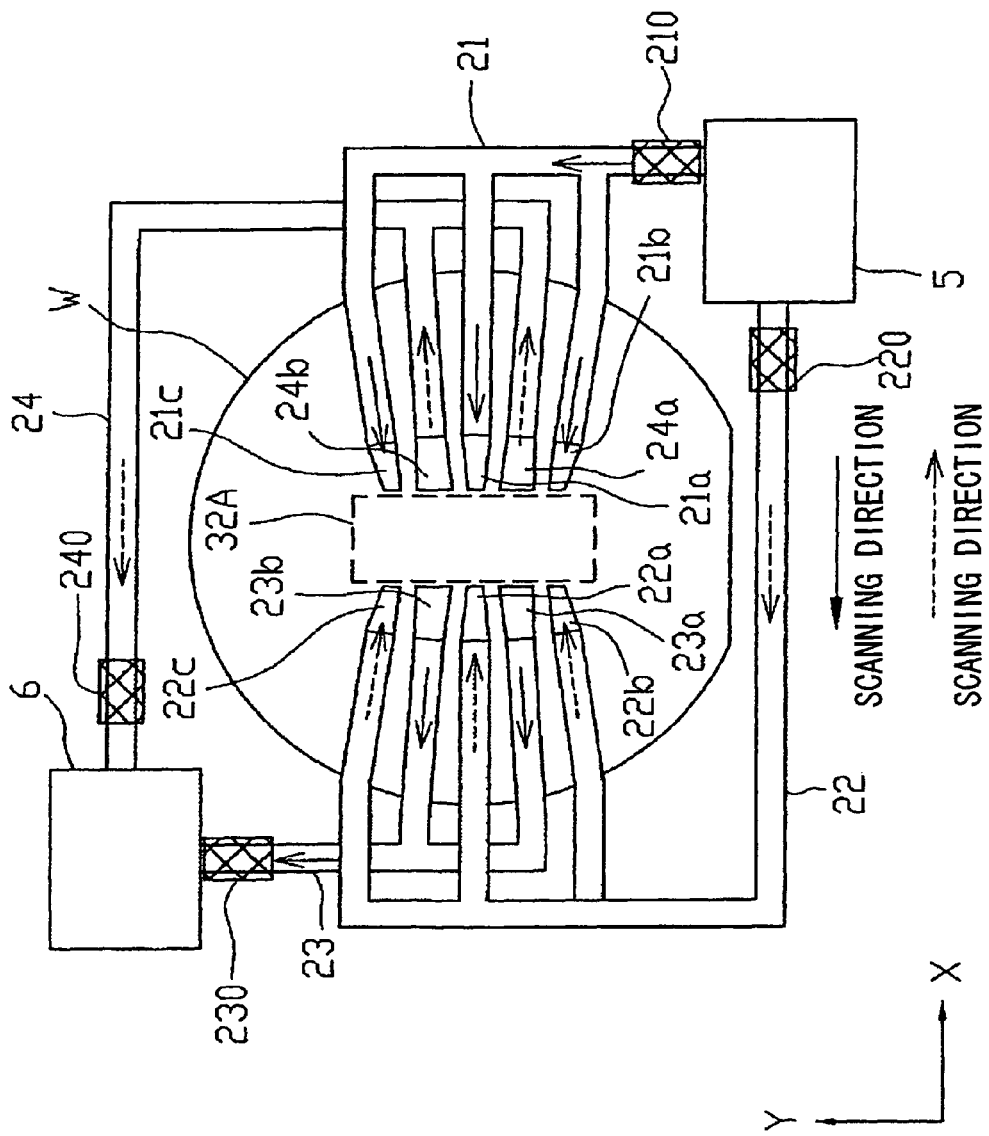
FIG. 6 is a drawing that shows the positional relationship between the front end portion of the optical element of the projection optical system and the discharge nozzle and inflow nozzle for the X direction relating to the second embodiment.

FIG. 6 is a drawing that shows the positional relationship between the front end portion 32A of the optical element 32 of the projection optical system PLA and the discharge nozzles and the inflow nozzles for supplying and recovering the liquid 7 in the X direction. As shown in FIG. 6, three discharge nozzles 21a to 21c provided on the +X direction side of the front end portion 32A which is a long, narrow rectangular shape in the Y direction, are connected to the liquid supply apparatus 5 via a supply tube 21, and three discharge nozzles 22a to 22c provided on the −X direction side of the front end portion 32A are connected to the liquid supply apparatus 5. Also, as shown in FIG. 6, two inflow nozzles 23a, 23b provided on the −X direction side of the front end portion 32A, are connected to the liquid recovery apparatus 6 via a recovery tube 23, and two inflow nozzles 24a, 24b provided on the +X direction side of the front end portion 32A are connected to the liquid recovery apparatus 6 via a recovery tube 24.

If the wafer W is moved in the scanning direction (−X direction) shown by the solid line and scanning exposure is performed, the liquid supply apparatus 5 supplies the liquid 7 to the space between the front end portion 32A of the optical element 32 and the wafer W via the supply tube 21 and discharge nozzles 21a to 21c. The liquid recovery apparatus 6 recovers the liquid 7 supplied to the space between the front end portion 32A and the wafer W by means of the liquid supply apparatus 5 via the recovery tube 23 and inflow nozzles 23a and 23b. In this case, the liquid 7 flows on the wafer W in the −X direction, and the space between the optical element 32 and the wafer W is filled with the liquid 7.

Also, if the wafer W is moved in the direction (+X direction) shown by the dashed line arrow and scanning exposure is performed, the liquid supply apparatus 5 supplies the liquid 7 to the space between the front end portion 32A of the optical element 32 and the wafer W via the supply tube 22 and discharge nozzles 22a to 22c. The liquid recovery apparatus 6 recovers the liquid 7 supplied to the space between the front end portion 32A and the wafer W by the liquid supply apparatus 5 via the recovery tube 24 and inflow nozzles 24a and 24b. In this case, the liquid 7 flows on the wafer W in the +X direction, and the space between the optical element 32 and the wafer W is filled with the liquid 7.

In addition, the supply amount Vi ($m^3/s$) and the recovery amount Vo ($m^3/s$) of the liquid 7 are calculated based on Equation 2 below.

$$Vi = Vo = DSY \cdot v \cdot d \quad \text{(Equation 2)}$$

Here, "DSY" is the length (m) of the front end portion 32A of the optical element 32 in the X direction. Since "DSY" is input in advance, by calculating and adjusting the supply amount Vi ($m^3/s$) and the recovery amount Vo ($m^3/s$) of the liquid 7 based on Equation 2, the space between the optical element 32 and the wafer W is stably filled with the liquid 7 even during scanning exposure.

Also, when supply and recovery of the liquid 7 in the X direction are performed in the aforementioned way, using scale adhesion prevention mechanisms that have the same configuration as the scale adhesion prevention mechanisms relating to the first embodiment respectively provided on the supply tube and the recovery tube, adhesion of scale to the inner walls of the supply tube and the recovery tube and/or to the nozzles that supply and discharge the liquid is prevented by the same method as in the first embodiment. That is, as shown in FIG. 6, in scale adhesion prevention mechanisms 210 and 220 respectively provided on the supply tubes 21 and 22, lines of magnetic force act on the respective supply tubes, the scale component is neutrally or negatively charged, and the adhesion of scale to the supply tubes, etc., is prevented. Similarly, in scale adhesion prevention mechanisms 230 and 240 respectively provided on the recovery tubes 23 and 24, the adhesion of scale to the respective recovery tubes, etc., is prevented.

In addition, when the wafer W is step-moved in the Y direction, supply and recovery of the liquid 7 from the Y direction is performed by the same method as in the first embodiment.

Figure 7:
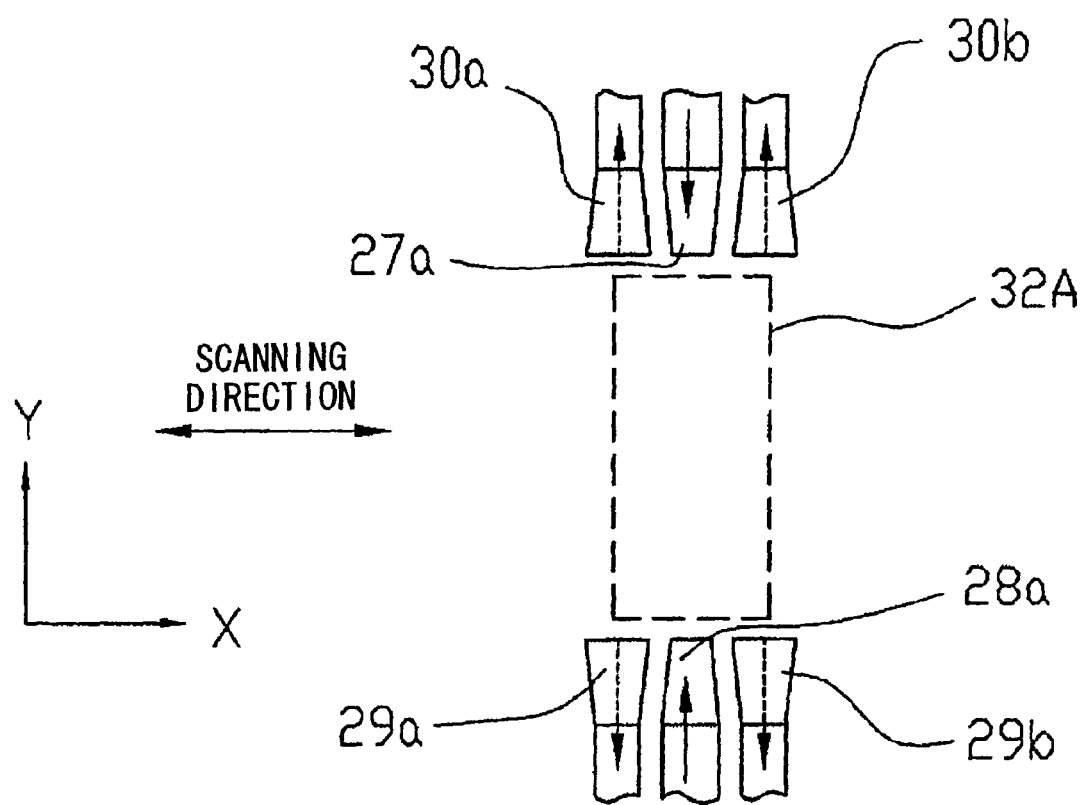
FIG. 7 is a drawing that shows the positional relationship between the front end portion of the optical element of the projection optical system and the discharge nozzle and inflow nozzle that perform supply and recovery of liquid from the Y direction relating to the second embodiment.

FIG. 7 is a drawing that shows the positional relationship between the front end portion 32A of the optical element 32 of the projection optical system PLA and the discharge nozzles and the inflow nozzles for the Y direction. As shown FIG. 7, if the wafer W is step-moved in the non-scanning direction (−Y direction), which is orthogonal to the scanning direction, discharge nozzle 27a and inflow nozzles 29a and 29b arrayed in the Y direction are used to perform supply and recovery of the liquid 7. Also, if the wafer is step-moved in the +Y direction, discharge nozzle 28a and inflow nozzles 30a and 30b arrayed in the Y direction are used to perform supply and recovery of the liquid 7. In this case, the supply amount Vi (m³/s) and the recovery amount Vo (m³/s) of the liquid 7 are calculated based on Equation 3 below.

$$Vi = Vo = DSX \cdot v \cdot d \quad \text{(Equation 3)}$$

Here, "DSX" is the length (m) of the front end portion 32A of the optical element 32 in the Y direction. In the same way as the first embodiment, by adjusting the supply amount of the liquid 7 according to the velocity of movement v of the wafer W, even when step-movement in the Y direction is caused, the space between the optical element 32 and the wafer W continues to be filled with the liquid 7.

In addition, when the liquid 7 is supplied and recovered in the Y direction in the aforementioned way, using scale adhesion prevention mechanisms that have the same configuration as the scale adhesion prevention mechanisms relating to the first embodiment respectively provided on the supply tube and the recovery tube, adhesion of scale to the inner walls of the supply tube and the recovery tube and/or to the nozzles that supply and discharge the liquid is prevented by the same method as in the first embodiment. That is, in the scale adhesion prevention mechanism provided on the supply tubes through which the liquid 7 supplied via nozzle 27a flows and in the scale adhesion prevention mechanism provided on the supply tube through which the liquid 7 supplied via nozzle 28a flows shown in FIG. 7, lines of magnetic force act on the supply tubes by means of a magnetic field generated using magnets, and thus, the scale component is neutrally or negatively charged, and the adhesion of scale to the supply tubes, etc., is prevented. Similarly, in the scale adhesion prevention mechanisms provided on the recovery tubes through which the liquid 7 recovered via nozzles 29a and 29b flows and in the scale adhesion prevention mechanism provided on the recovery tube through which the liquid 7 recovered via nozzles 30a and 30b flows, lines of magnetic force act on the recovery tubes by means of a magnetic field generated using magnets, and thus, the adhesion of scale to the respective recovery tubes, etc., is prevented.

According to the scanning type projection exposure apparatus relating to the second embodiment, in the scale adhesion prevention mechanisms respectively provided on the supply tube and the recovery tube, the scale component dissolved in the liquid is neutrally or negatively charged, so it is possible to prevent the adhesion of scale to the inner walls of the supply tube and the recovery tube and/or to the nozzles that supply and discharge the liquid. Therefore, the flow of liquid within the supply tube or the recovery tube is always fixedly maintained, so it is possible to continue to stably fill the space between the optical element and the wafer with the liquid.

In addition, the index of refraction n of purified water with respect to exposure light whose wavelength is approximately 200 nm is approximately 1.44, and ArF excimer laser light, which has a 193 nm wavelength, is shortened to 1/n, that is, approximately 134 nm, on the wafer W, so it is possible to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and it is possible to further improve resolution.

In addition, according to the projection exposure apparatus relating to this second embodiment, two pairs of discharge nozzles and inflow nozzles that are mutually reversed in the X direction and the Y direction are provided, so it is possible to continue to stably fill the space between the wafer W and the optical element 32 with the liquid 7 even in the case where the wafer W is moved in the +X direction, the −X direction, the +Y direction or the −Y direction. That is, by flowing liquid in a direction that corresponds to the movement direction of the wafer W, it is possible to continue to fill the space between the wafer W and the front end portion of the projection optical system PL with the liquid 7.

Also, since liquid 7 flows on the wafer W, even in the case where foreign matter adheres on the wafer W, that foreign matter can flow away by means of the liquid 7. In addition, since the liquid 7 is adjusted to the prescribed temperature by means of the liquid supply apparatus 5, the temperature of the wafer W surface also becomes constant, and it is possible to prevent a degradation of an overlay accuracy resulting from thermal expansion of the wafer W generated at the time of exposure. Therefore, even in the case where there is a time difference between alignment and exposure such as in EGA (enhanced global alignment) system alignment, it is possible to prevent a degradation of an overlay accuracy resulting from thermal expansion of the wafer.

In addition, according to the scanning type projection exposure apparatus relating to this second embodiment, since the liquid 7 flows in the same direction as that in which the wafer W is moved, it is possible to recover the liquid that has absorbed impurities and heat by means of a liquid recovery apparatus 6 without causing it to remain on the exposure region directly under the front end portion 32A of the optical element 32.

Note that, according to the first and second embodiments described above, in the scale adhesion prevention mechanism, lines of magnetic force act on the supply tubes and recovery tubes by means of a magnetic field generated using magnets to prevent scale adhesion, but it may also be such that lines of magnetic force act on the supply tubes and recovery tubes by means of a magnetic field generated by the electric current that flows to coils wound on the supply tube to prevent scale adhesion. For example, a coil is wound on the outer walls of the supply tube, a weak electric current modulated by a magnetic generation converter is caused to flow to the coil wound on this supply tube to generate a magnetic field, and lines of magnetic force are caused to act on the supply tube due to this magnetic field. In addition, energy is generated based on electronic excitation action resulting from the liquid flowing within the supply tube on which the lines of magnetic force act, and thus, the scale component is negatively charged by the generated energy. Therefore, the scale component dissolved in the liquid that flows through the supply tube is negatively charged, and the adhesion of scale to the supply tubes, etc., is prevented based on lines of magnetic force that have been caused to act on the supply tube by the magnetic field generated by the electric current that has flowed to the coil.

Also, in the first and second embodiments described above, scale adhesion prevention mechanisms are respectively provided on the supply tube and the recovery tube, but it may also be such that a scale adhesion prevention mechanism is provided only on the supply tube. That is, it may be such that the adhesion of scale to the inner walls of the supply tube and the recovery tube and/or to the nozzles that supply and discharge the liquid is prevented by causing the scale component dissolved in the liquid to be neutrally or negatively charged when the liquid is supplied. Or, a scale adhesion prevention mechanism may also be provided only on the recovery tube. In addition, scale adhesion prevention mechanisms may be installed in a plurality of locations on the respective supply tubes and recovery tubes. For example, they may be further installed in the vicinity of the respective nozzles so that nozzle clogging and the adhesion of scale to the optical element of the wafer side of the projection optical system can be even more effectively prevented. In addition, scale adhesion prevention mechanisms need not be directly attached to the supply tube, the recovery tube, etc., and they may be also be supported by separate members in the vicinity of the supply tube, the recovery tube, etc.

Also, in the first and second embodiments described above, even in cases where substances are eluted from the wafer and/or the film formed on the wafer surface, and foreign matter adheres on the wafer, through the operation of the scale adhesion prevention mechanism, adhesion of impurities such as those types of eluted substances and foreign matter to the discharge nozzles and/or the recovery nozzles can be restricted. Moreover, even if impurities such as those types of eluted substances and foreign matter are recovered along with the liquid from the inflow nozzles and have flowed to the recovery tubes, through the operation of scale adhesion prevention mechanism, it is possible to prevent impurities such as those types of eluted substances and foreign matter from accumulating (adhering) at the inner walls of the recovery tubes, etc.

In addition, in the first and second embodiments described above, the space between the surface of the wafer and the optical element formed by fluorite of the projection optical system on the wafer side is filled with the liquid, but the liquid may also be interposed in a portion of the space between the surface of the wafer and the optical element formed by fluorite of the projection optical system on the wafer side.

Also, in the first and second embodiments described above, the configuration is such that the optical path space on the emergence side of the optical elements 4, 32 of the projection optical system is filled with a liquid (demineralized water), but as disclosed in PCT International Publication No. 2004/019128, it may also be such that the optical path space on the incidence side of the optical elements 4, 32 of the projection optical system is also filled with a liquid (demineralized water). In this case, an adhesion prevention mechanism that prevents the adhesion of impurities to the members (supply tubes, recovery tubes, etc.) that form the flow path of the liquid for the optical path space on the incidence side of the optical elements 4, 32 of the projection optical system may also be built in.

In addition, in the first and second embodiments described above, purified water is used as the liquid 7, but the liquid is not limited to purified water, and it is also possible to use one that is permeable to the exposure light, that has an index of refraction that is as high as possible, and that is stable with respect to the optical element and the photoresist coated on the surface of the wafer (for example, cedar oil).

In addition, in the first and second embodiments described above, there are no particular limitations on the number and shape of the nozzles. For example, in the second embodiment, supply or recovery of the liquid 7 may be performed by two pairs of nozzles for the long side of the front end portion 32A. Note that, in this case, since it is possible to supply and recover the liquid 7 from either the +X direction or the −X direction, it is also possible to arrange the discharge nozzles and the inflow nozzles vertically.

In addition, if $F_2$ laser light is used as the exposure light, a fluorine group oil or a fluorine group liquid, such as perfluoropolyether (PFPE), that can be permeated by $F_2$ laser light may be used as the liquid.

In addition, in the first and second embodiments described above, an exposure apparatus in which the space between the projection optical system PL and the wafer (substrate) W is locally filled with a liquid is employed, but the present invention may also be applied to a liquid immersion exposure apparatus that moves a stage that holds the substrate subject to exposure within a liquid bath, such as that disclosed in Japanese Unexamined Patent Application, First Publication No. H6-124873, and to a liquid immersion exposure apparatus that forms a liquid pool of a prescribed depth on a stage and holds the substrate therein, such as that disclosed in Japanese Unexamined Patent Application, First Publication No. H10-303114.

In the above way, in the first and second embodiments described above, it is possible to prevent impurities from adhering to the members that form the flow path of the liquid, such as the supply tubes and/or the recovery tubes, so it is possible to stably supply and recover liquid. In addition, impurities within the liquid through which the exposure light passes become fewer, and it is possible to prevent the adhesion of impurities to the final optical elements 4, 32 of the projection optical system.

Figure 8:
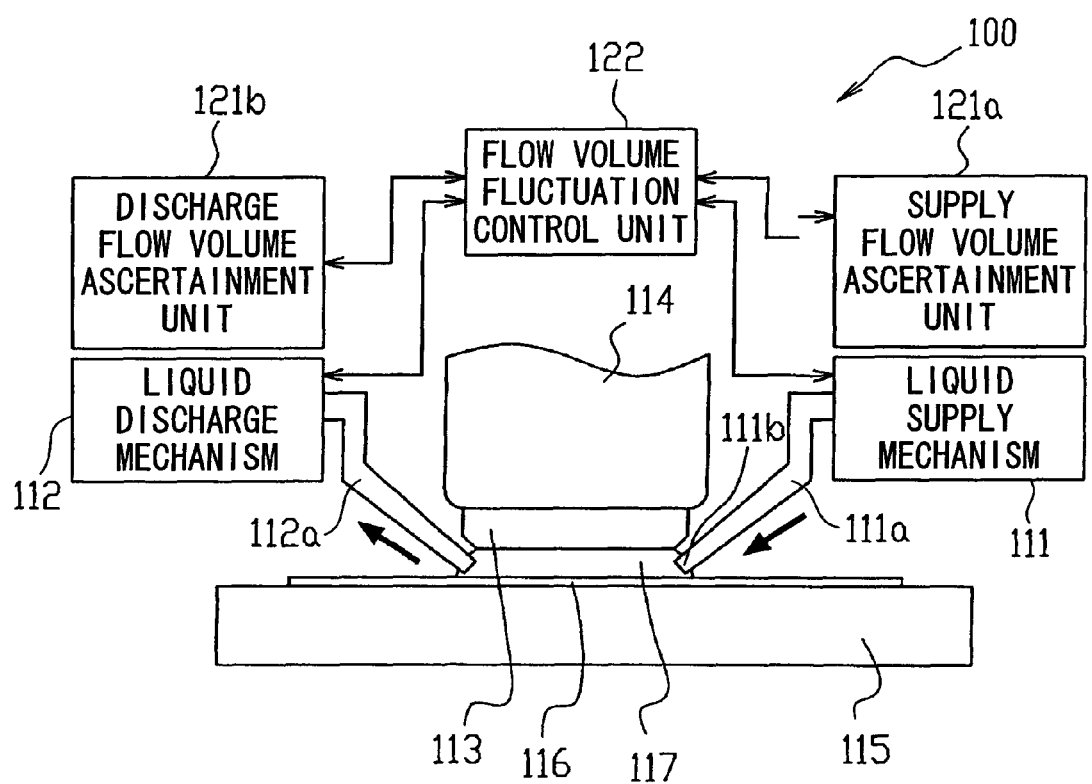
FIG. 8 is a drawing that shows the schematic configuration of a liquid immersion type projection exposure apparatus relating to the third embodiment.

Next, the projection exposure apparatus relating to the third embodiment of the present invention will be explained while referring to drawings. FIG. 8 is a drawing that shows the overall configuration of the liquid immersion projection exposure apparatus relating to the third embodiment.

As shown in FIG. 8, this liquid immersion type projection exposure apparatus 100 includes an optical component 113, a projection optical system 114, a stage 115, an illumination optical system (not shown in the drawing), a light source (not shown in the drawing), a liquid supply mechanism 111, a liquid supply flow path 111a, a liquid discharge mechanism 112 and a liquid discharge flow path 112a. Note that a bubble removal filter may be provided at the front end portion 111b of the liquid supply flow path 111a.

In the embodiment below, an ArF (excimer) laser is used as a light source, and the optical element 113 produced from a lens that uses a synthetic calcium fluoride monocrystal as a material is used. Since the closest lens to the silicon wafer 116 is such that the fluence of the ArF (excimer) laser is high and a rise in the refractive index called compaction occurs in synthetic quartz glass, a synthetic calcium fluoride monocrystal in which this phenomenon does not occur is used as the material. Note that it is also possible to use another light source such as a KrF excimer laser or an $F_2$ laser as the light source.

In addition, in the embodiment below, an explanation will be given using an aqueous solution in which salts have been dissolved as the liquid. Also, the uppermost surface of the lens (optical component 113) that comes into contact with the aqueous solution in which salts are dissolved is coated with magnesium fluoride that has good durability with respect to the aqueous solution in which salts are dissolved. Note that it is also possible to use purified water that does not contain salts as the liquid.

Provided for the liquid immersion type projection exposure apparatus 100 are a supply flow volume ascertainment unit 121a and a discharge flow volume ascertainment unit 121b, which are for respectively obtaining the liquid supply flow volume and liquid discharge flow volume per unit time, and a flow volume fluctuation control unit 122 for causing the liquid supply flow volume per unit time and the liquid discharge flow volume per unit time to fluctuate. The supply flow volume ascertainment unit 121a and discharge flow volume ascertainment unit 121b are respectively provided with liquid flow volume meters, and they are respectively connected to the mass flow meters discussed below.

While exposure is being performed, the liquid supply mechanism 111 for supplying the liquid 117 and the liquid discharge mechanism 112 for discharging the liquid 117 from the portion that has been filled with the liquid 117 are controlled by the flow volume fluctuation control unit 122 so that the gap between the optical component 113 and the silicon wafer 116 is filled with a constant amount of liquid 117.

Note that the gap between the optical component 113 and the silicon wafer 116 need not always be filled with a constant amount of liquid 117. What is essential is that the amount of liquid 117 in the gap between the optical component 113 and the silicon wafer 116 can be changed if the optical path of the laser light (exposure light) from the light source is filled with the liquid 117 so that leakage are not caused.

Next, the basic operations during exposure of the liquid immersion type projection exposure apparatus 100 with a cleaning function will be explained. After the laser light from the laser source and the illumination optical system irradiates a mask and projects the mask pattern, the laser light is reduction-exposed onto the object of exposure, for example, a silicon wafer 116, set on the stage 115 via the projection optical system 114 that includes the optical component 113. Exposure is performed in a status in which the space between the optical component 113 and the silicon wafer 116 has been filled with the liquid 117. The liquid 117 has a high refractive index compared to the air, so it is possible to implement exposure with high resolution.

Normally, exposure is repeatedly implemented on one silicon wafer 116, and the reduction pattern of the same mask is exposed onto the silicon wafer 116 a plurality of times. That is, a process is repeated whereby, when a certain exposure is finished, the stage 115 is driven to move the silicon wafer 116 to a prescribed position for the next exposure, and the next exposure is implemented.

Next, cleaning of the liquid flow path will be explained. Cleaning of the liquid flow path in the third embodiment is implemented by causing the liquid supply flow volume to fluctuate over time. By performing this type of cleaning, substances that become causes of solid matter such as salts dissolved in the liquid are removed, and adherence of the solid matter to the walls in the flow path is prevented.

Basic operations of the flow volume fluctuation control unit 122 at the time of an increase in the liquid supply flow volume will be explained. The flow volume fluctuation control unit 122 manages the pressurization value and timing for changing the liquid supply flow volume. That is, the flow volume fluctuation control unit 122 sends pressurization signals corresponding to the liquid supply flow volume one would like to increase to the liquid supply mechanism 111 at a prescribed time. The liquid supply mechanism 111 that has received the pressurization signals from the flow volume fluctuation control unit 122 supplies liquid using pressurization and performs intermittent supply by means of an electromagnetic switch valve. This type of processing makes it possible to increase the liquid supply flow volume only by the desired amount.

A mass flow meter and a mass flow controller with high accuracy and good response are connected to the liquid supply mechanism 111. This mass flow meter detects the electric current that changes to follow small temperature changes that occur due to fluctuations of the liquid flow volume with good sensitivity, and the liquid flow volume is ascertained as electrical signals. The obtained electrical signals are transmitted to the mass flow controller continuously. This mass flow controller has a piezo valve that is capable of high speed opening and closing control. In this way, it is possible to precisely control the liquid flow volume supplied per unit time.

Next, the basic operations of the flow volume fluctuation control unit 122 at the time of an increase in the liquid discharge flow volume will be explained. The flow volume fluctuation control unit 122 manages the depressurization value and timing for changing the liquid discharge flow volume. That is, the flow volume fluctuation control unit 122 sends depressurization signals corresponding to the liquid discharge flow volume one would like to increase to the liquid discharge mechanism 112 at a prescribed time. The liquid discharge mechanism 112 that has received the depressurization signals from the flow volume fluctuation control unit 122 discharges the liquid through depressurization and performs intermittent discharge by means of an electromagnetic switch valve. This type of processing makes it possible to increase the liquid discharge flow volume only by the desired amount.

A mass flow meter and a mass flow controller with high accuracy and good response are connected to the liquid discharge mechanism 112. This mass flow meter detects the electric current that changes to follow small temperature changes that occur due to fluctuations of the liquid flow volume with good sensitivity, and the liquid flow volume is ascertained as electrical signals. The obtained electrical signals are transmitted to the mass flow controller one by one. This mass flow controller has a piezo valve that is capable of high speed opening and closing control. In this way, it is possible to precisely control the liquid flow volume removed per unit time.

Operation of the flow volume fluctuation control unit 122 in the case where the liquid supply flow volume fluctuates with time will be explained in detail below. If the liquid supply flow volume fluctuates along the time axis in an intermittent, pulse or pulsation pattern, the time fluctuations of the liquid volume to be discharged will normally accompany the time delay or changes in fluctuation pattern itself with respect to time fluctuations of the liquid supply flow volume. In such a case, the flow volume fluctuation control unit 122 controls the liquid discharge mechanism 112 while taking into account the time delay or the changes in fluctuation pattern itself with respect to time fluctuations of the liquid supply flow volume, and through this operation, a balance between the supply flow volume and the discharge flow volume of the liquid will be maintained as an average.

As described above, by controlling the liquid supply mechanism and the liquid discharge mechanism so that the liquid supply flow volume per unit time and the liquid discharge flow volume per unit time are fluctuated with a cooperation, the flow volume fluctuation control unit 122 is able to fixedly maintain the liquid surface shape of the liquid 117 in the gap between the optical member 113 and the silicon wafer 116. That is, it is possible to restrict fluctuations in the liquid volume in the gap between the optical member 113 and the silicon wafer 116 and to prevent leakage of liquid.

Also, the fluctuation pattern of the discharge flow volume differs according to the supply fluctuation pattern and requires precise control, so the flow volume fluctuation control unit 122 is constituted by a CPU and a memory that store these fluctuation patterns.

With the above, the explanation of the function of cleaning the liquid flow path has ended. By implementing the aforementioned series of operations, fluctuations with time occur in the liquid supply flow volume, and cleaning in the liquid immersion type projection exposure apparatus 100 with a cleaning function is implemented.

The method relating to the third embodiment of the present invention, for implementing the cleaning realized by causing the flow volume of the supply liquid to fluctuate will be explained below.

Figure 10:
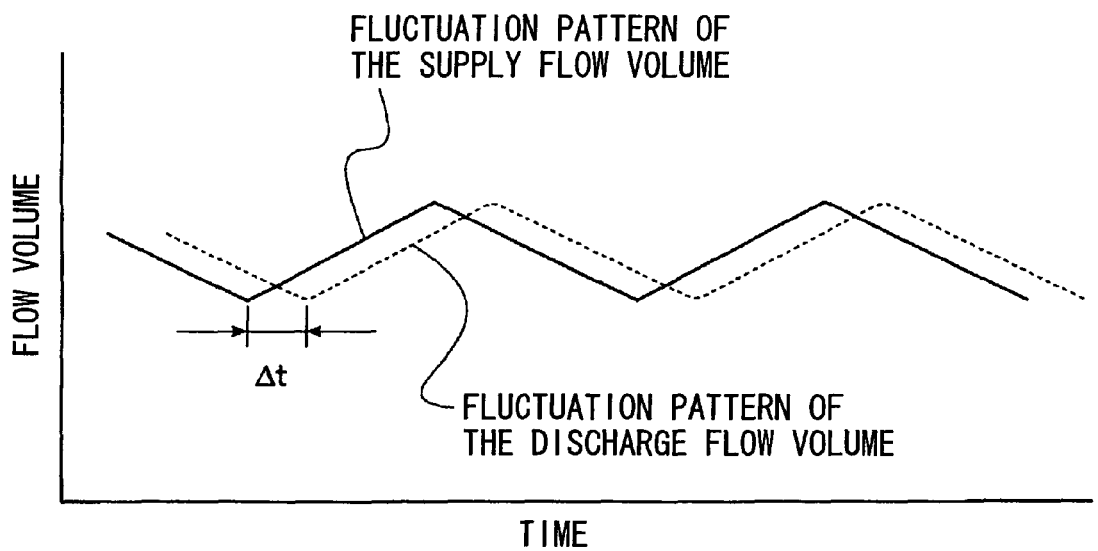
FIG. 10 is an explanatory drawing for fluctuations of the liquid supply flow volume relating to the third embodiment.

FIG. 10 is an explanatory drawing relating to the third embodiment, for fluctuations in the liquid supply flow volume. When liquid is supplied, the liquid supply flow volume per unit time is caused to fluctuate at an amplitude of 0.1% or more with respect to the time average value of the liquid supply flow volume in the pattern shown in FIG. 10. Note that the fluctuation period is set to 0.2 seconds.

Substances that are a cause of solid matter are removed from the liquid supply flow path 111*a* in this way, so that the solid matter is prevented from being mixed into the liquid and damaging the surface of the optical component 113 of the projection optical system. Therefore, it is also possible to prevent troubles such as degradation in the quantity of exposure light attributable to physical damage to the surface of the optical component 113.

Figure 13:
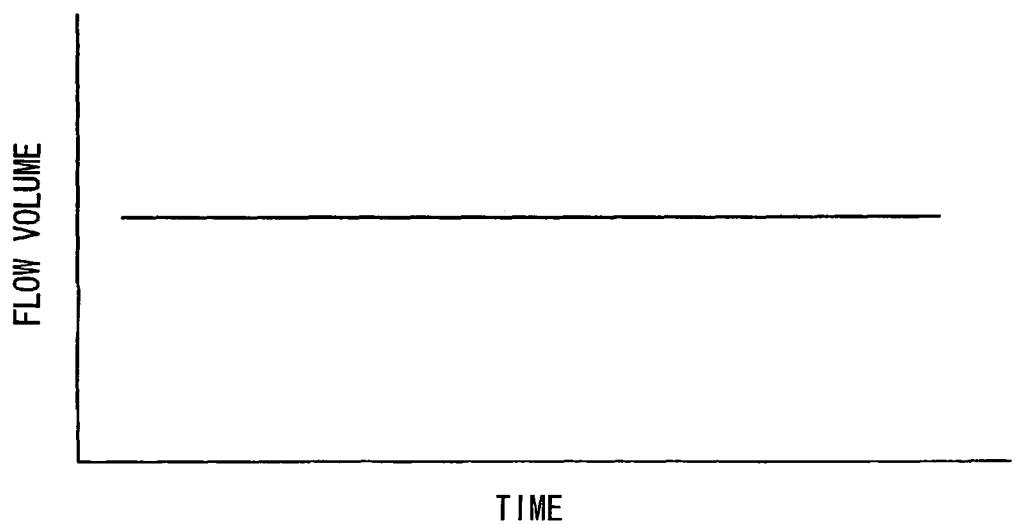
FIG. 13 is an explanatory drawing for the conventional liquid supply flow volume.

When the liquid 117 is being supplied while the liquid immersion type projection exposure apparatus 100 is at work, the liquid supply flow volume is caused to fluctuate in a supply flow volume fluctuation pattern such as that shown by the solid line in FIG. 10. In the conventional method, the liquid supply flow volume per unit time is substantially constant as in FIG. 13, but, in the present embodiment, supply is performed while causing fluctuation of 0.1% or more. Note that in order to obtain adequate cleaning results, it is preferable that fluctuation be 0.1% or more. There are no particular limitations on the fluctuation period, but since it is difficult to perform precise fluctuation control at a period of 0.1 seconds or less, fluctuation should be caused at a period of 0.1 seconds or more. In addition, for the fluctuation pattern of the discharge flow volume, the time delay $\Delta t$ and/or changes in the fluctuation pattern of the supply flow volume are taken into account, and discharge is performed at a discharge flow volume fluctuation pattern such as that shown by the broken line of FIG. 10 so that the supply flow volume and discharge flow volume per period become equal.

Figure 11:
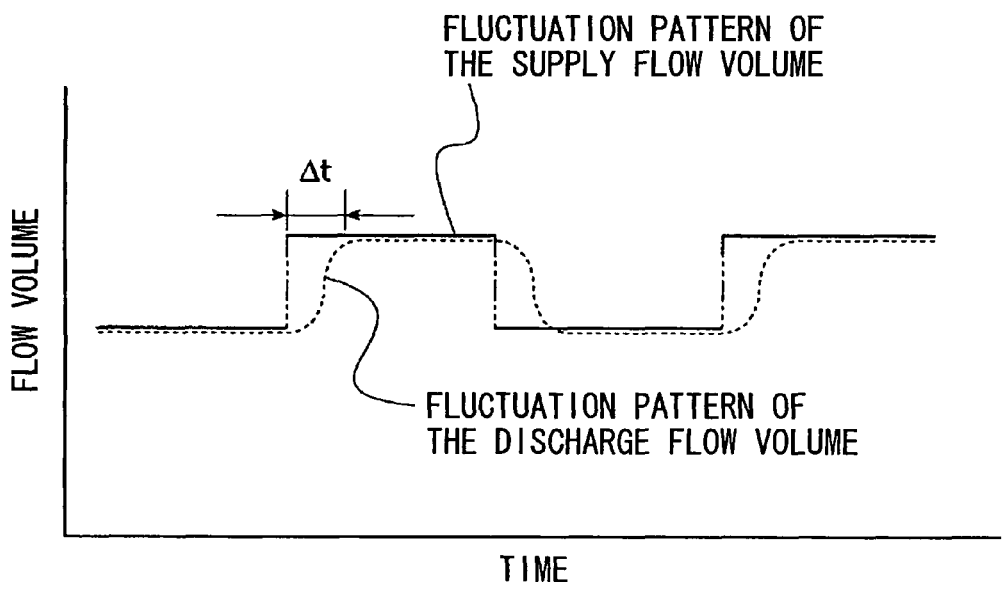
FIG. 11 is an explanatory drawing for fluctuations of the liquid supply flow volume relating to the third embodiment.
Figure 12:
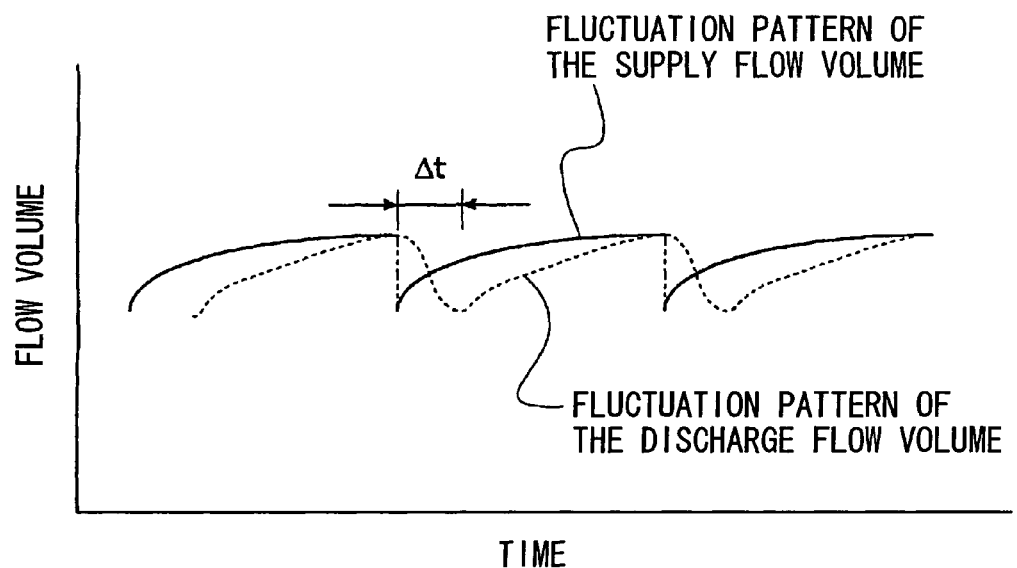
FIG. 12 is an explanatory drawing for fluctuations of the liquid supply flow volume relating to the third embodiment.

Cleaning may also be performed using the supply flow volume and the discharge flow volume fluctuation patterns shown in FIG. 11 and FIG. 12. In the fluctuation pattern shown in FIG. 12, 0.1% fluctuation is exerted on the liquid supply volume, and the fluctuation period is 0.5 seconds.

If this operation is implemented, substances that are a cause of solid matter are removed from the liquid supply flow path 111*a*, so that the solid matter is prevented from being mixed into the liquid and damaging the surface of the optical component 113 of the projection optical system. Therefore, it is also possible to prevent problems such as degradation in the quantity of exposure light attributable to physical damage to the surface of the optical component 113. In addition, the liquid discharge flow volume is also caused to fluctuate, so cleaning of the liquid discharge flow path 112*a* can also be performed simultaneously. Furthermore, for the fluctuation pattern of the discharge flow volume, the time delay $\Delta t$ and/or changes in the fluctuation pattern of the supply flow volume are taken into account, and discharge is performed at a discharge flow volume fluctuation pattern such as that of the dashed lines of FIG. 11 and FIG. 12 so that the supply flow volume and discharge flow volume per period become equal.

In the above way, by operating the liquid supply mechanism 111 and the liquid discharge mechanism 112 together via the flow volume fluctuation control unit 122, the liquid surface shape of the liquid 117 is maintained to be nearly constant even if the amount of supplied liquid fluctuates with time. Therefore, overflowing of liquid due to the liquid flow volume fluctuations does not occur. In addition, it is also possible to perform the exposure process while performing cleaning.

Also, if cleaning is not performed during exposure, the cleaning schedule may be advance programmed in the flow volume fluctuation control unit 122, which includes a CPU and a memory. Or, the cleaning function may be performed for at a prescribed time before the start of exposure of one silicon wafer 116 and/or at a prescribed time after the end of all exposure.

Figure 9:
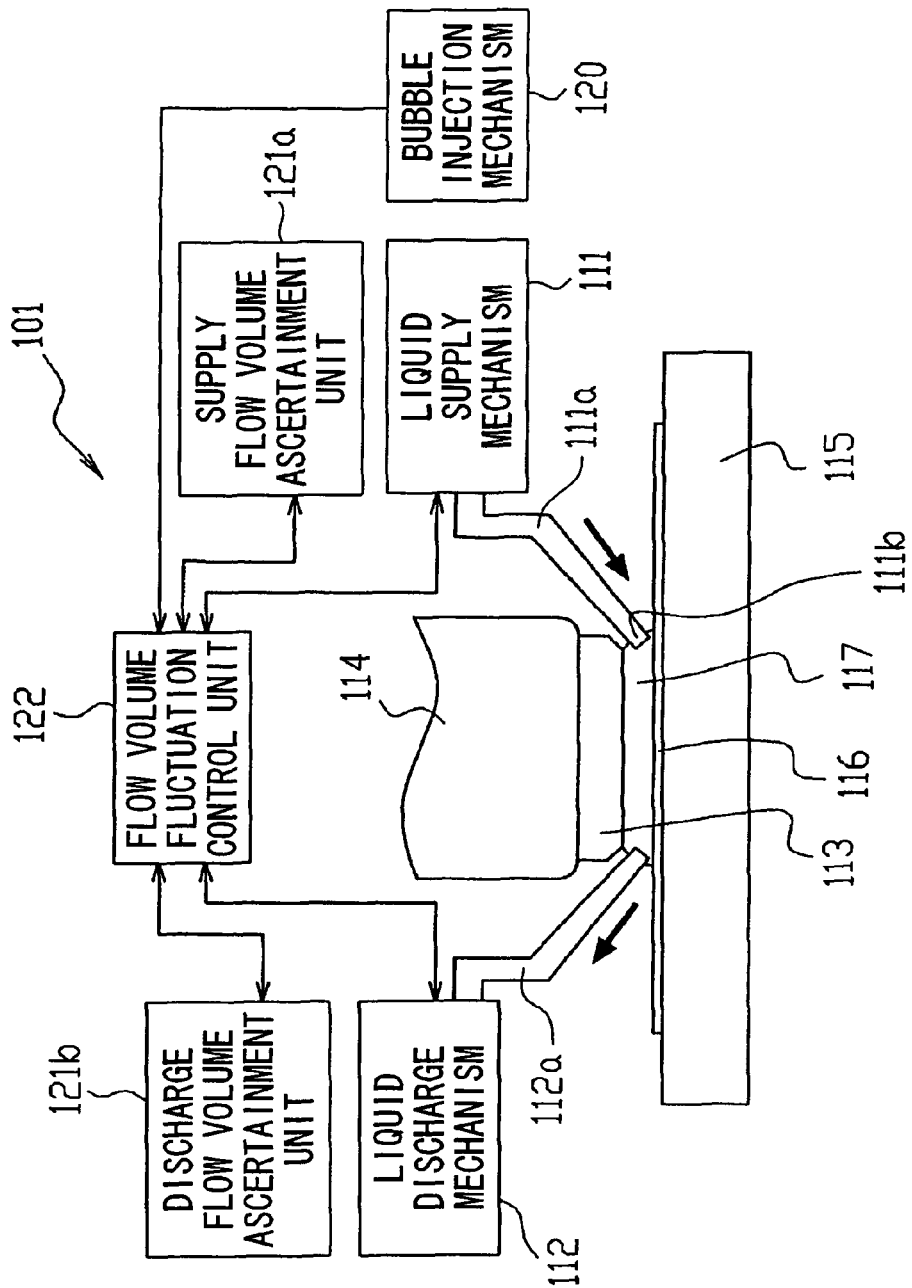
FIG. 9 is a drawing that shows the schematic configuration of a liquid immersion type projection exposure apparatus relating to the fourth embodiment.

Next, the projection exposure apparatus relating to the fourth embodiment of the present invention will be explained while referring to drawings. FIG. 9 is a drawing that shows the overall configuration of the liquid immersion type projection exposure apparatus 101 relating to the fourth embodiment. Note that, in FIG. 9, the explanation will be given while assigning the same codes as are used in the third embodiment to configurations that are identical to those of the projection exposure apparatus relating to the third embodiment.

In the fourth embodiment of the present invention, the supply side liquid flow path is cleaned by injecting and supplying bubbles into the supply liquid.

A bubble injection mechanism 120 is provided on the liquid supply mechanism 111 for supplying liquid. The pressure of a gas, such as nitrogen, argon or air, is adjusted to gauge pressure 10 kPa, which is moderately higher than atmospheric pressure using a pressure valve. The gas is sealed in by an electromagnetic switch valve, and it is injected into the liquid via a thin needle-shaped hollow tube after passing through this valve. Other configurations and actions are the same as the configuration of the projection exposure apparatus relating to the third embodiment, so an explanation thereof has been omitted.

In the present embodiment, one bubble of 1 ml of nitrogen is injected to match the timing at which exposure to the silicon wafer 116 stops. This type of injection is performed for each 10,000 L of supply liquid.

Substances that are a cause of solid matter are removed from the liquid supply flow path 111*a* in this way, so that the solid matter is prevented from being mixed into the liquid and damaging the surface of the optical component 113 of the projection optical system. Therefore, it is also possible to prevent problems such as degradation in the quantity of exposure light attributable to physical damage to the surface of the optical component 113. In the liquid into which bubbles have been injected, there is a difference in density between the gas and the liquid, so it is conceivable that the liquid flow volume fluctuates locally. For this reason, an effect of preventing the adhesion of solid matter to the walls in the flow path, is exhibited.

The gas for generating bubbles may be an inert gas, such as nitrogen or argon, or air. An amount of the bubble of approximately 1 ml or less is sufficient. The frequency of injection of these types of bubble should be approximately one time per 10,000 L of liquid, and the number of bubbles in one injection should be a plurality, but even one bubble would be effective. In this case as well, substances that are a cause of solid matter are removed, and the solid matter is prevented from adhering to the walls in the flow path, so it is possible to prevent physical damage to the lens surface.

Note that, in the fourth embodiment, the injection of bubbles is avoided during exposure, because there is a possibility that the bubbles will scatter the exposure light, and the bubbles should be injected on the occasion of stage driving in which exposure is not performed. In such a case, for the cleaning schedule, the stage driving schedule in an exposure may be programmed in advance in the flow volume fluctuation control unit 122 including the CPU and the memory.

As for other methods of implementation, cleaning may also be performed by attaching a bubble removing filter to the front end portion 111b of the liquid supply flow path 111a. Due to this, bubbles are eliminated in the front end portion 111b, so it is possible to perform bubble cleaning without considering the timing of stage driving. In such a case, it is also possible to use a filter with which the fluctuation pattern of the liquid discharge flow volume resulting from filter attachment does not change in comparison to the fluctuation pattern of the liquid discharge flow volume in the case where no filter is attached. Or, in the case where a filter is attached in which there is a change in the fluctuation pattern of the liquid discharge flow volume in comparison to the fluctuation pattern of the liquid discharge flow volume in the case where no filter is attached, the flow volume fluctuation control unit 122 must, of course, set the discharge flow volume fluctuation pattern while taking the influence thereof into account.

In addition, as a separate method of the fourth embodiment, many small bubbles may be injected into the liquid to perform a bubbling-cleaning of the flow path of the liquid.

Also, the fourth embodiment described above may be such that the liquid supply flow path 111a is cleaned, but if the bubbles injected from the liquid supply flow path side 111a flow into the liquid discharge flow path 112a, it would be possible to clean the liquid discharge flow path 112a, and liquid discharge flow path 112a cleaning may be performed by injecting bubbles to the liquid discharge flow path 112a from the vicinity of the front end portion (liquid contact portion) of the liquid discharge flow path 112a.

In the above way, in the third and fourth embodiments, it is possible to clean the liquid flow path without giving overly strong physical stimulus or causing physical damage to the flow path of the liquid (walls, etc.).

In addition, in the third and fourth embodiments, since liquid is used during exposure, chemical stimulus is never given to the liquid flow path, so the walls, etc., of the liquid flow path are not damaged.

Also, in the third and fourth embodiments, even if impurities are mixed into the flow path and/or small impurities adhere to the walls, etc., of the flow path, cleaning of the flow path is performed in the appropriate maintenance period when the exposure operation is stopped, so it is possible to maintain the cleanness of the flow path of the liquid, and it is possible to stably perform liquid supply and discharge (recovery). Therefore, it is possible to reduce the replacement frequency and maintenance frequency of the members (components) that come into contact with the liquid, so it is possible to maintain the high operating rate of the liquid immersion type exposure apparatus.

In addition, in the third and fourth embodiments, before small impurities that have adhered to the walls, etc., of the flow path become large solid matter, those adhering substances are removed from the flow path, so that solid matter is prevented from being mixed into the liquid and damaging the surface of the optical component 113 of the projection optical system. Therefore, it is also possible to prevent problems such as degradation in the quantity of exposure light attributable to physical damage to the surface of the optical component 113.

In the third and fourth embodiments described above, a synthetic calcium fluoride monocrystal is used as the optical component, but synthetic calcium fluoride monocrystals have high durability with respect to high energy density laser light, and it is possible to perform cleaning using a liquid immersion type projection exposure apparatus that uses an appropriate material for the optical component positioned on the front end of the projection optical system.

Also, in the third and fourth embodiments described above, an optical component with the uppermost surface being coated with magnesium fluoride is used, so it is possible to provide a liquid immersion type projection exposure apparatus with a cleaning function attached that prevents damage of the calcium fluoride surface, which has low mechanical strength.

In addition, in the third and fourth embodiments described above, if an aqueous solution in which salts are dissolved is used as the liquid, it is possible to restrict dissolution of the optical component, and degradation in the mechanical strength resulting from dissolution are prevented, so it is possible to further prevent damage to the surface of the optical element. In addition, if an aqueous solution in which salt is dissolved is used, it becomes easier for solid matter to adhere to the flow path, so a flow path cleaning effect is markedly apparent. Furthermore, purified water may also be used as the liquid having high exposure light transmittivity, and it is also possible to use other liquids for liquid immersion exposure without being limited to purified water or aqueous solutions.

In addition, in the third and fourth embodiments described above, a liquid that is different from the liquid used in exposure may be used to perform flow path cleaning.

Also, in cleaning the liquid flow path, physical cleaning in which dirt is peeled off with ultrasonic waves, chemical cleaning in which dirt is dissolved with acids or alkalis, etc., are considered to be simple methods, and it is also possible to appropriately incorporate these methods with the third embodiment or the fourth embodiment.

In addition, since the inner walls of the liquid discharge flow path 112a and the front end portions of the liquid supply flow path 111a and the liquid discharge flow path 112a come into contact with the liquid 117, there is a possibility that foreign matter that has adhered to the silicon wafer 116 and/or substances eluted from the silicon wafer 116 or film of the surface of the silicon wafer 116 will adhere to them, but in the third and fourth embodiments, cleaning of the flow path is performed in the appropriate period, so it is possible to maintain the cleanness of the flow path of the liquid.

In addition, in the third and fourth embodiments described above, an exposure apparatus in which the space between the optical component 113 and the silicon wafer 116 is locally filled with a liquid is employed, but the present invention may also be applied to a liquid immersion type projection exposure apparatus that moves a stage that holds the substrate subject to exposure within a liquid bath, such as that disclosed in Japanese Unexamined Patent Application, First Publication No. H06-124873, and to a liquid immersion type projection exposure apparatus that forms a liquid pool of a prescribed depth on a stage and holds the substrate therein, such as that disclosed in Japanese Unexamined Patent Application, First Publication No. H10-303114.

In addition, in the third and fourth embodiments described above, the configuration is such that the optical path space of the emergence side of the optical component 113 side of the projection optical system is filled with a liquid (demineralized water), but as disclosed in PCT International Publication No. 2004/019128, it may also be such that the optical path space of the incidence side of the optical component 113 of the projection optical system is also filled with a liquid (demineralized water).

In addition, the present invention can also be applied to twin stage exposure apparatuses that separately mount the substrate to be processed, such as a wafer, and are provided with two stages that are independently movable in the XY direction as disclosed in, for example, Japanese Unexamined Patent Application, First Publication No. H10-163099, Japanese Unexamined Patent Application, First Publication No. H10-214783 and Published Japanese Translation No. 2000-505958 of PCT International Application.

In addition, in the first through fourth embodiments described above, the optical members (4, 32, 113) of the trailing end of the projection optical system may be lenses, and they may also be plane parallel plates with no refractive power.

The base material of the final optical members (4, 32, 113) of the projection optical system is not limited to fluorite, and it may also be formed of other materials such as quartz.

Also, in the first through fourth embodiments described above, the projection optical system may be a refraction type optical system that does not include a reflecting optical element, a reflecting type optical system that does not include a refracting optical element, or a catadioptric type optical element that includes a reflecting optical element and a refracting optical element.

Figure 14:
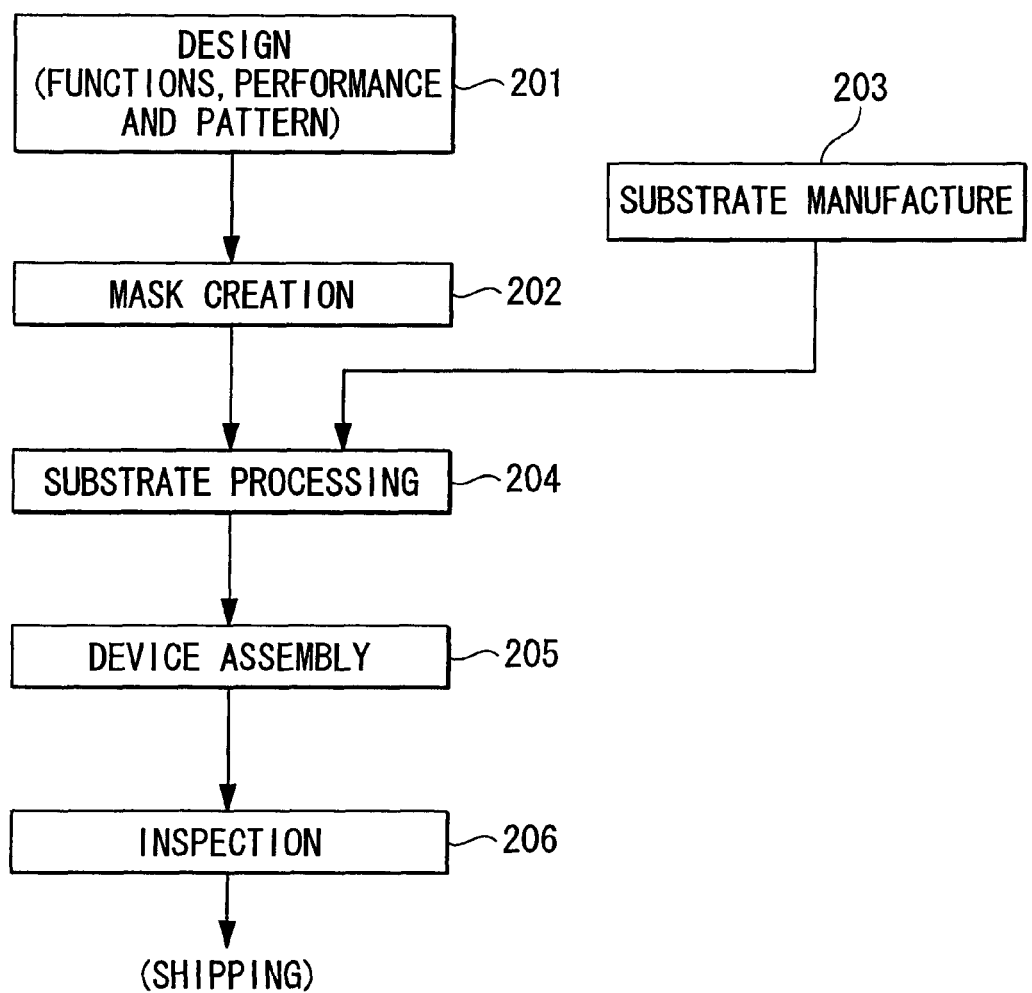
FIG. 14 is a flow chart that shows an example of the semiconductor device manufacturing process.

As shown in FIG. 14, microdevices such as semiconductor devices are manufactured by going through a step 201 that performs microdevice function and performance design, a step 202 that creates the mask (reticle) based on this design step, a step 203 that manufactures the substrate (wafer) that is the device base material, an exposure processing step 204 that exposes the pattern on the mask onto a substrate by means of an exposure apparatus of the aforementioned embodiments, a device assembly step (including the dicing process, bonding process and packaging process) 205, an inspection step 206, etc.

In addition, by performing maintenance (cleaning) of the aforementioned liquid immersion type projection exposure apparatus at the appropriate time, it is possible to manufacture microdevices such as high performance semiconductor devices with good yield.

In the aforementioned way, the projection exposure apparatus and the cleaning method of the projection exposure apparatus of this invention and the projection exposure apparatus maintenance method and the device manufacturing method are applied to use in the manufacture of devices such as high performance semiconductor elements, image pickup elements, liquid crystal display elements and thin film magnetic heads.

What is claimed is:

1. A liquid immersion type projection exposure apparatus in which a space under an optical element is filled with a liquid, the liquid immersion type projection exposure apparatus comprising:
   a liquid supply system connected to a supply flow path, which supplies the liquid to the space via the supply flow path;
   a liquid recovery system connected into a recovery flow path, which removes the liquid from the space to the recovery flow path; and
   a cleaning system which performs a cleaning operation, the cleaning system having a flow meter which ascertains a liquid supply flow volume per unit time and a controller which controls the liquid supply system and the liquid recovery system such that (i) the liquid supply flow volume per unit time fluctuates, and (ii) the liquid in the space under the optical element covers only a portion of a surface of an object located under the optical element by supplying the liquid to the space via the liquid supply path and recovering the liquid from the space into the recovery flow path.

2. The projection exposure apparatus according to claim 1, wherein:
   the cleaning system has a flow meter, which ascertains a liquid recovery flow volume per unit time, and
   the controller controls the liquid supply system and the liquid recovery system so that the liquid supply flow volume per unit time and the liquid recovery flow volume per unit time become linked and fluctuate.

3. The projection exposure apparatus according to claim 1, wherein the liquid supply flow volume per unit time fluctuates at an amplitude of 0.1% or more with respect to a time average value of the liquid supply flow volume.

4. The projection exposure apparatus according to claim 1, wherein the cleaning system performs the cleaning operation when exposure has stopped.

5. The projection exposure apparatus according to claim 1, wherein the optical element is a synthetic calcium fluoride monocrystal.

6. The projection exposure apparatus according to claim 5, wherein a surface of the optical element that contacts the liquid is coated with magnesium fluoride.

7. The projection exposure apparatus according to claim 1, wherein purified water or an aqueous solution in which salts are dissolved is used as the liquid.

8. The projection exposure apparatus according to claim 1, wherein the liquid supply flow path is cleaned during the cleaning operation.

9. The projection exposure apparatus according to claim 1, wherein the liquid recovery flow path is cleaned during the cleaning operation.

10. A device manufacturing method that uses the liquid immersion type projection exposure apparatus as recited in claim 1.

11. A cleaning method of a liquid immersion type projection exposure apparatus in which a space under an optical element is filled with a liquid while supplying the liquid to the space via a supply flow path and recovering the liquid from the space into a recovery flow path, the method comprising:
    placing an object under the optical element such that the space is located between the optical element and a surface of the object; and
    performing a cleaning operation in which (i) the liquid supply flow volume per unit time fluctuates, and (ii) the liquid in the space under the optical element covers only a portion of the surface of the object placed under the optical element by supplying the liquid to the space via the liquid supply path and recovering the liquid from the space into the recovery flow path.

12. The cleaning method of the projection exposure apparatus according to claim 11, wherein the liquid supply flow per unit time fluctuates at an amplitude of 0.1% or more with respect to a time average value of the liquid supply flow volume.

13. A device manufacturing method that uses the cleaning method of a liquid immersion type projection exposure apparatus as recited in claim 11.

14. The cleaning method of the projection exposure apparatus according to claim 11, wherein the liquid recovery flow volume per unit time fluctuates during the cleaning operation.

15. The cleaning method of the projection exposure apparatus according to claim 11, wherein the liquid supply flow volume per unit time and the liquid recovery flow volume per unit time become linked and fluctuate during the cleaning operation.

* * * * *